(12) United States Patent
Miyajima et al.

(10) Patent No.: US 7,621,714 B2
(45) Date of Patent: Nov. 24, 2009

(54) POD CLAMPING UNIT IN POD OPENER, POD CORRESPONDING TO POD CLAMPING UNIT, AND CLAMPING MECHANISM AND CLAMPING METHOD USING POD CLAMPING UNIT

(75) Inventors: Toshihiko Miyajima, Tokyo (JP); Tsutomu Okabe, Tokyo (JP); Jun Emoto, Tokyo (JP)

(73) Assignee: TDK Corporation, Tokyo (JP)

( * ) Notice: Subject to any disclaimer, the term of this patent is extended or adjusted under 35 U.S.C. 154(b) by 271 days.

(21) Appl. No.: 10/969,077

(22) Filed: Oct. 21, 2004

(65) Prior Publication Data

US 2005/0095098 A1    May 5, 2005

(30) Foreign Application Priority Data

| Oct. 23, 2003 | (JP) | ............................. 2003-363378 |
| Jan. 23, 2004 | (JP) | ............................. 2004-015030 |
| Jan. 23, 2004 | (JP) | ............................. 2004-015034 |
| Jan. 26, 2004 | (JP) | ............................. 2004-016718 |
| Jan. 26, 2004 | (JP) | ............................. 2004-016719 |

(51) Int. Cl.
    *H01J 5/02*    (2006.01)
(52) U.S. Cl. .................. 414/810; 414/411; 414/939
(58) Field of Classification Search ............... 414/217, 414/938, 217.1, 411, 939, 810; 410/80; 70/278.7, 70/280
    See application file for complete search history.

(56) References Cited

U.S. PATENT DOCUMENTS

| 5,137,063 A | * | 8/1992 | Foster et al. ................... 141/98 |
| 5,302,078 A | * | 4/1994 | Essick et al. ................. 414/811 |
| 5,772,386 A | | 6/1998 | Mages et al. |
| 6,158,946 A | * | 12/2000 | Miyashita ................... 414/411 |
| 6,168,364 B1 | * | 1/2001 | Miyajima ................... 414/217 |

(Continued)

FOREIGN PATENT DOCUMENTS

JP    51-72884    6/1976

(Continued)

OTHER PUBLICATIONS

Patent Abstracts of Japan, JP 11-354622, Dec. 24, 1999.

(Continued)

*Primary Examiner*—James Keenan
(74) *Attorney, Agent, or Firm*—Oblon, Spivak, McClelland, Maier & Neustadt, L.L.P.

(57) ABSTRACT

An object of the present invention is to provide a clamping mechanism and the like, which have no likelihood of contacting the under surface of a pod when the pod is mounted on a mounting board at a loading port. To achieve the object, as an unit for clamping the pod, it is configured to comprise a clamp arm capable of nipping a clamped portion of the pod in its top end portion, a clamp member drive mechanism for performing the nipping and releasing operations of the clamp arm, and a lifting mechanism for moving up and down each clamp arm together the clamp member drive mechanism for the mounting board surface. At that time, an inclined surface having a predetermined angle for up and down directions is formed in the lower part end portion of the top end in at least one from among the clamp arms.

1 Claim, 18 Drawing Sheets

U.S. PATENT DOCUMENTS

| | | | |
|---|---|---|---|
| 6,176,667 B1 * | 1/2001 | Fairbairn et al. | 414/217 |
| 6,281,516 B1 | 8/2001 | Bacchi et al. | |
| 6,318,945 B1 * | 11/2001 | Hofmeister | 414/217 |
| 6,326,614 B1 | 12/2001 | Bacchi et al. | |
| 6,470,927 B2 * | 10/2002 | Otaguro | 141/98 |
| 6,501,070 B1 | 12/2002 | Bacchi et al. | |
| 6,502,869 B1 | 1/2003 | Rosenquist et al. | |
| 6,676,356 B2 * | 1/2004 | Saeki et al. | 414/217 |
| 2001/0048866 A1 * | 12/2001 | Sakiya et al. | 414/217 |
| 2002/0044859 A1 * | 4/2002 | Lee et al. | 414/411 |

FOREIGN PATENT DOCUMENTS

| | | | | |
|---|---|---|---|---|
| JP | 54-152593 | * | 11/1979 | 414/411 |
| JP | 54-152594 | * | 11/1979 | 414/411 |
| JP | 60-2514 | | 1/1985 | |
| JP | 60-160962 | | 10/1985 | |
| JP | 61-71934 | | 4/1986 | |
| JP | 5-21587 | | 1/1993 | |
| JP | 5-52304 | | 7/1993 | |
| JP | 5-52305 | | 7/1993 | |
| JP | 10-315084 | | 12/1998 | |
| JP | 2001-225236 | | 8/2001 | |
| JP | 2002-164406 | | 6/2002 | |
| JP | 2002-164412 | | 6/2002 | |
| JP | 2002-246432 | | 8/2002 | |
| JP | 2003-92328 | | 3/2003 | |
| JP | 2003-297896 | | 10/2003 | |
| JP | 2003-297903 | | 10/2003 | |

OTHER PUBLICATIONS

Patent Abstracts of Japan, JP 2000-016583, Jan. 18, 2000.
Patent Abstracts of Japan, JP 2002-164412, Jun. 7, 2002.
Patent Abstracts of Japan, JP 2003-092328, Mar. 28, 2003.
Patent Abstracts of Japan, JP 2003-297903, Oct. 17, 2003.

* cited by examiner

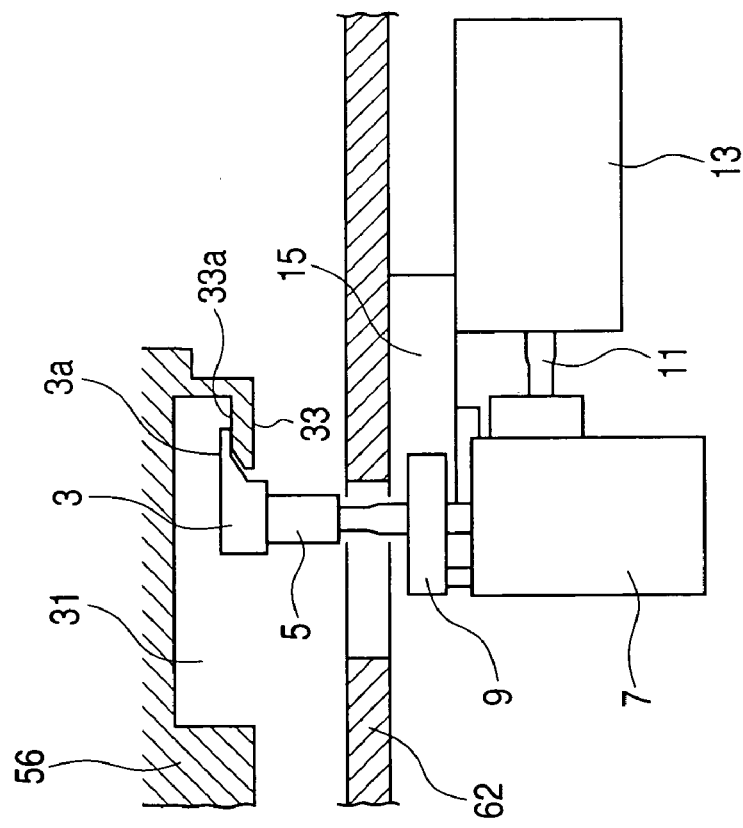
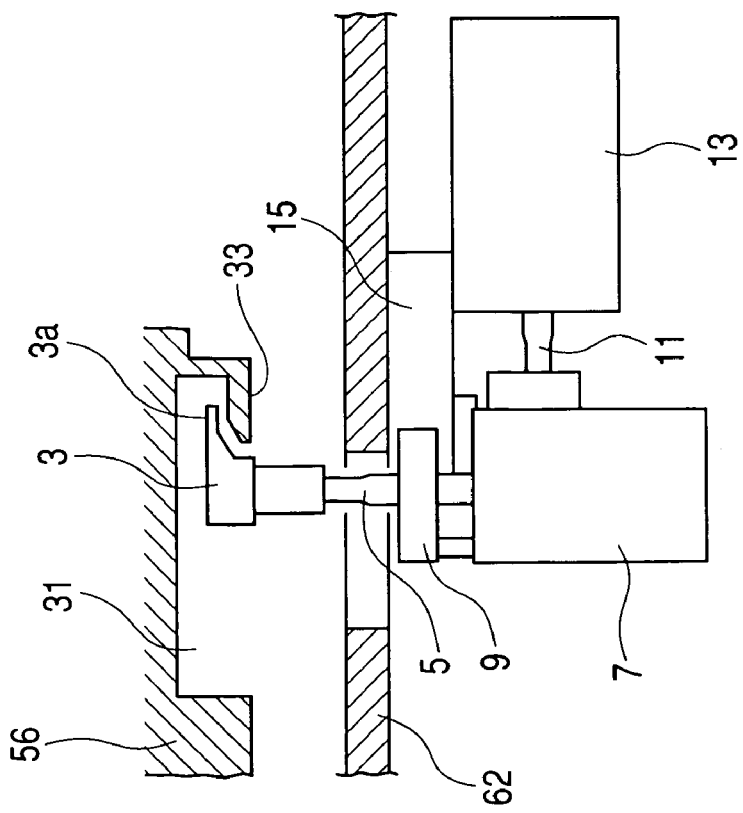

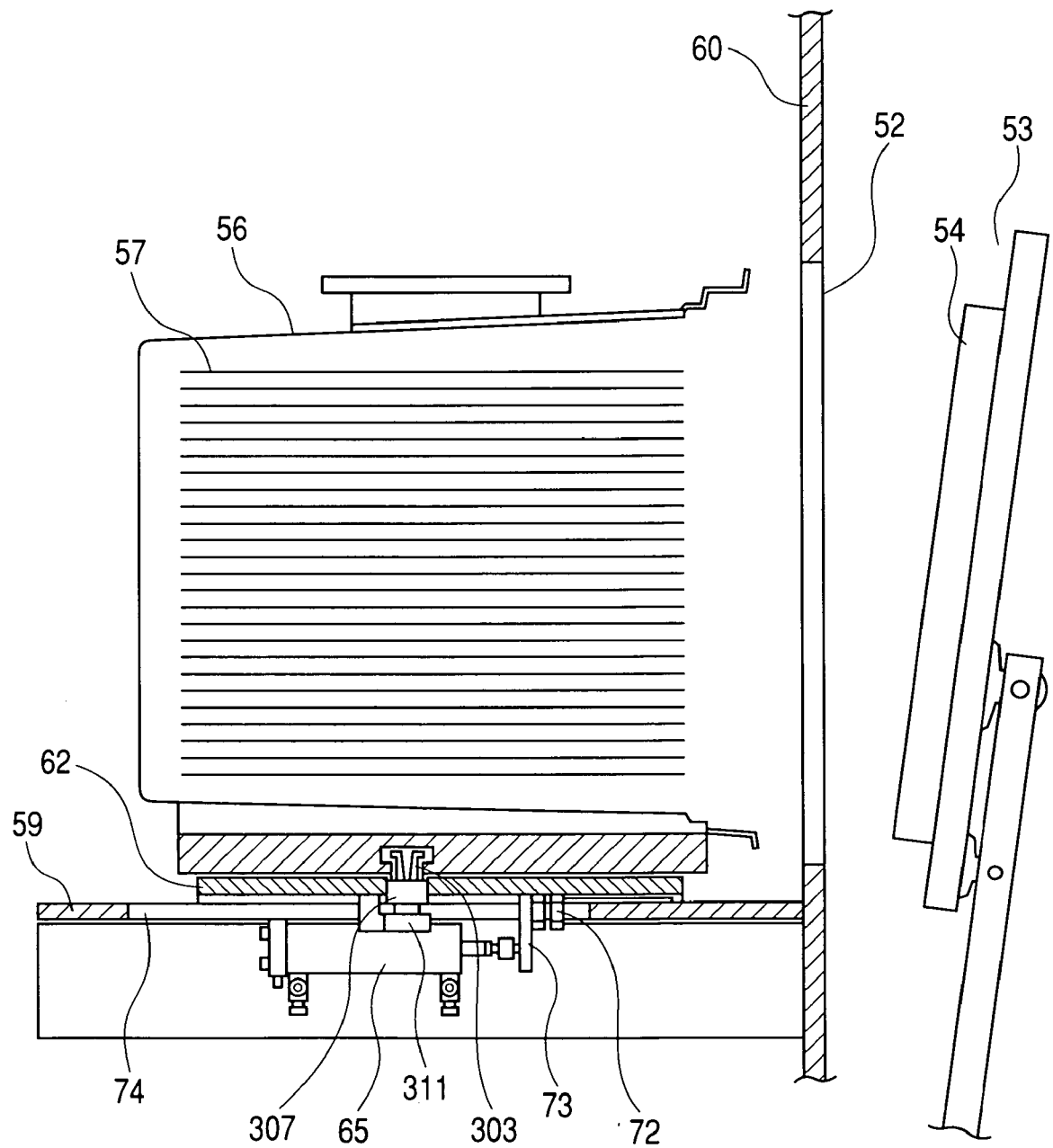

POD CLAMPING UNIT IN POD OPENER, POD CORRESPONDING TO POD CLAMPING UNIT, AND CLAMPING MECHANISM AND CLAMPING METHOD USING POD CLAMPING UNIT

BACKGROUND OF THE INVENTION

1. Field of the Invention

The present invention relates to a so-called FIMS (front-opening interface mechanical standard), in which a pod is mounted and used when a wafer held within a transfer container called a pod is moved to a semiconductor processing unit in a semiconductor manufacturing process, and more in particular, it relates to a pod clamping unit for fixing the pod to the FIMS system, a pod corresponding to the unit, and a clamping mechanism and a clamping method using the unit in the FIMS system which is mounted with a pod called a FOUP (front-opening unified pod) and which transfers a semiconductor wafer to the pod.

2. Related Background Art

Heretofore, in general, the semiconductor manufacturing process has been performed within a so-called clean room, in which an interior of the room handling the semiconductor wafer is highly cleansed. However, in view of the enlargement of a wafer size and the cost reduction required for management of the clean room, in recent years, a system has been adopted where the interior of the processing unit, the pod (accommodation container of the wafer), and a micro space used for delivering a substrate from the pod to the processing unit alone are kept highly clean.

The pod comprises a shelf capable of holding a plurality of wafers in its interior in a parallel and spaced apart state, a main body portion having an approximate cubical form with an opening to be used for taking the wafer in and out at its one side, and a lid for closing the opening portion. The pod in which a formative surface of this opening portion is arranged not vertically below the pod, but on one side surface (front surface for the micro space) is named genetically the FOUP (front-opening unified pod), and the present invention mainly targets at a configuration using this FOUP.

The above-described micro space comprises a first opening portion facing a pod opening, a door for closing the first opening, a second opening provided at the semiconductor processing unit side, and a transfer robot for approaching the pod interior from the first opening portion to hold the wafer and transferring the wafer to the processing unit side by passing through the second opening. The configuration to form the micro space has at the same time a mounting board for supporting the pod in such a manner that the pod opening portion is placed in a correct position to a door front surface.

A positioning pin which is fitted in a hole for positioning provided in the pod bottom face and regulates a mounting position of the pod, and the clamping unit which is engaged with a clamped portion provided in the pod bottom face and fixes the pod to the mounting board are arranged on the upper surface of the mounting board. Usually, the mounting board is capable of moving back and forth for a predetermined distance in a door direction. When the wafer within the pod is to be transferred to the processing unit, the pod is moved until the pot lid contacts the door in a state of the pod being mounted, and after the contact, the lid is removed from the pod opening by the door. By these operations, the pod interior and the processing unit interior are communicated through the micro space, and subsequently, the transfer operation of the wafer is repeatedly performed. The mounting board, the door, the first opening portion, the opening and closing mechanism of the door, and the wall forming part of the micro space in which the first opening portion are formed is named generically the FIMS (front-opening interface mechanical standard) system.

The clamping mechanism in the FIMS system consists of an engaging concave portion having a clamped portion protruded toward the center of a concave portion as if to cover part of a concave opening portion, the concave portion being provided in the pod bottom face, and the clamping unit arranged in the mounting board side. As a conventional clamping unit, the configuration has been known, which is disclosed, for example, in Japanese Patent Application Laid-Open No. 2002-164412, U.S. Pat. No. 6,501,070B1 specification, and U.S. Pat. No. 6,281,516B1 specification. The clamping unit disclosed in Japanese Patent Application Laid-Open No. 2002-164412 is configured such that it swingably supports the center portion of an approximate bar-shaped member in which a latch claw is formed at its one end, and the other end is connected to an actuator. In this configuration, a mechanism is such that, by driving the other end by the actuator, the clamp portion is rotated, and the latch claw is engaged with the clamped portion of the pod. Further, the clamping unit disclosed in U.S. Pat. No. 6,281,516B1 specification is configured such that the latch claw rotating around an axial center is engaged with the clamped portion of the pod.

However, in the above described configuration, when the pod is to be fixed, the latch claw reaches a final stopping position while sliding on the clamped portion. Hence, there is high possibility that particles and like are generated, and in the FIMS system which extremely dislikes generation and existence of the particles and the like, this configuration has come to be out of use. In place of this configuration, in recent years, a configuration comprising a clamping unit shown below (see U.S. Pat. No. 6,501,070B1 specification) has come to be used.

In the clamping unit, a clamp member having an approximate T-shaped form is used. To be more specific, after the pod is placed on a predetermined position of the mounting board, the clamp member is lifted once, and after stopping within a swing space provided within the pod, turns 90 degrees, and after that, descends so as to engage with the clamped portion protruded as if to narrow a downward opening of the swing space. In this configuration, being different from the case of Japanese Patent Laid-Open No. 2002-164412, since there is no friction caused between the clamp member and the clamped portion surface, the particles and the like caused by this friction are sharply reduced.

The clamping unit disclosed in the U.S. Pat. No. 6,501,070B1 specification uses a rotary clamp cylinder and the like disclosed in Japanese Utility Model Application Laid-Open No. 5-52305. The rotary clamp cylinder, when an expandable and contactable piston rod changes from an expandable state to a shrunk state, has a direction of the piston rod in a flat surface vertical to the expandable and contactable axis turned 90 degrees. Actually, a clamp member is fixed on the upper portion of the piston rod and used. In a clamping operation, in a state of the pod being mounted on the mounting board, the clamp member protruded from the mounting board surface has already entered the engaging concave portion. By shrinking the piston rod from this state, the clamp member engages with the clamped portion, and the fixing of the pod is performed.

However, in the system disclosed in the U.S. Pat. No. 6,501,070B1 specification, a large swing space for allowing the T-shaped clamp member to rotate within the pod is required. This swing space has its opening narrowed by the existence of the clamped portion, and is a space not directly accessible when the cleaning and the like are to be performed. The existence of such a space difficult to access is not preferable in view of keeping a cleanliness factor of the pod.

By changing the T-shaped form into a form where a portion used for the clamp is protruded in one direction alone, the space difficult to access can be made small to a certain extent. Further, by so doing, the protruded portion on the mounting board surface can be also reduced. However, the rotary clamp cylinder used for this method is, because of its configuration, required to expand the piston rod at all the time with the pod being in a non-engaged state. Hence, when the pod is mounted on the mounting board, there is a fear of inviting a problem that the pod bottom face and the clamp member of the piston rod top end are brought into contact with each other prior to the pod positioning by the positioning pin, and the pod is given an unnecessary impact or the particles and the like expected not to generate by nature are generated.

The problem relating to this impact can be similarly generated even in the method disclosed in the U.S. Pat. No. 6,501,070B1 specification, where, because of the requirement of various configurations for rotation of the T-shaped clamp member or reason and the like for positioning by requirement of a large swing region, the T-shaped portion has no other choice but protrude on the mounting board surface. Further, the clamp member disclosed in the U.S. Pat. No. 6,501,070B1 specification adopts a configuration to move up and down accompanied with the movement of the mounting board, and even from this point, the clamp member is configured necessarily to protrude from the mounting board surface.

Further, in recent years, accompanied with the enlargement of the wafer size, the pod itself has been proceeding with its enlargement and the increase in its weight. Hence, the above described situation that might take place such as the unnecessary contact and collision between the clamp member and the pod bottom face, which were out of the question before, has been becoming actualized. In case the pod itself and all the weight of the wafer accommodated into it become heavy, there is high possibility that the above described unnecessary impact becomes large, and it is necessary to prevent such a situation from happening beforehand.

Further, accompanied with the enlargement of the pod and the increase in its weight, a load generated by inertia at the pod moving time and an impact generated at the wafer transfer time and the like also become large. In this case, the conventional clamping unit is relatively low in a capacity to fix the pod, and it is considered from now on that there arises a possibility of the mounting position of the pod being shifted by the application of some loads on the pod.

Further, in recent years, there have been demands aiming at allowing such a FIMS system to correspond to a so-called open cassette. However, to correspond to the current FOUP, it is inevitable and imperative to have a configuration where a protruding portion other than the pin for positioning exists on the mounting board surface. Hence, it is impossible to mount the open cassette on the mounting board as long as the FIMS system for the FOUP is concerned.

SUMMARY OF THE INVENTION

The present invention has been made in view of the above described situation, and an object of the invention is to provide a pod clamping unit, a pod corresponding to the unit, and a clamping mechanism or a clamping method using the unit wherein a member required for the clamp is not protruded from the surface of a mounting board when a pod clamping for fixing the pod to a FIMS system is performed and a sliding with a clamped portion is simply a contact alone when clamping, and moreover, a region difficult to access in an engaging concave portion is limited to the minimum smallest possible.

To solve the above-described problem, the pod clamping unit according to the present invention is a pod clamping unit for fixing the pod on a mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, and comprises a horizontal cylinder for supporting one end of a horizontal cylinder by being fixed to a rear surface of the mounting board, and at the same time, for expanding and shrinking a horizontal cylinder rod in a first direction, and a vertical cylinder for supporting one end of a vertical cylinder by being fixed to the other end of the horizontal cylinder, and at the same time, for expanding and shrinking the vertical cylinder rod in a second direction, and a clamp member fixed to the other end of the vertical cylinder rod, wherein the mounting board is further penetratable by the vertical cylinder, and has an opening making it possible for the existence of the clamp member on the mounting board surface, and the clamp member is positioned at a predetermined height from the mounting board surface which does not contact the bottom face of the pod when the pod is mounted on the mounting board surface in a state of the vertical cylinder rod being shrunk.

Further, to solve the above described problem, the pod clamping mechanism according to the present invention is a pod clamping mechanism comprising the pod clamping unit and the engaging concave portion provided in the bottom face of the pod, wherein the engaging concave portion comprises an engaging hole capable of accommodating the clamp member in a predetermined depth and an opening portion communicated with the engaging hole having an inner width approachable by the clamp member, and an clamped portion which is engageable with a part of the clamp portion by the clamp member being driven in the first direction and closes a part of the engaging hole by neighboring to the opening portion.

Further, to solve the above described problem, the pod according to the present invention is a pod comprising a pod main body to open at one side surface and a lid to open and close an opening, and at the same time, capable of accommodating the wafer in its interior and has an engaging concave portion used when mounted and fixed to the mounting board in the pod opener which makes it possible to insert and take out of the wafer into and from the interior of the pod by opening and closing the lid, wherein the engaging concave portion comprises an engaging hole having a inner depth capable of accommodating the clamp member in a pod opener in a predetermined depth, an opening portion communicated with the engaging hole having a width approachable by the clamp member, and clamped portion, which is engageable with a part of the clamp portion by the clamp member being driven in the first direction and is adjacent to the opening portion and closing a portion of the engaging hole.

Further, to solve the above described problem, the pod clamping method according to the present invention is a pod clamping method for fixing the pod on a mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, wherein the pod clamping method comprises the steps of: mounting the pod on a predetermined position on the mounting board surface; protruding the clamp member arranged on the mounting board to the engaging portion provided in the pod bottom face from the mounting board surface by using a first cylinder; moving the clamp member and the first cylinder in a predetermined direction by using a second cylinder; and engaging the clamped portion neighboring to the opening portion of the engaging concave potion with the clamp portion by moving the clamp member in a direction reverse to a protruded direction by using the first cylinder.

According to the present invention, the clamp member exists below from the mounting board surface, and when the pod is mounted on the mounting board, the positioning operation by using the positioning pin can be easily and smoothly performed. Further, by using an air cylinder and the like, it is possible to configure a mechanism required to drive the clamp member from a simple and compact mechanism. That is, in the present invention, being different from the disclosure of Japanese Utility Model Application Laid-Open No. 5-052305, since the clamping mechanism is configured by using a plurality of compact cylinders with rods expandable and contactable in an uniaxial direction only, it is possible to make the outer shape smaller as the clamping unit, and moreover, to reduce its weight smaller also. Consequently, without sharply changing the previous arrangement and the like of various mechanisms in the FIMS system, it is possible to use the configuration according to the present invention. As a result, it is possible to attempt the weight saving of the mounting board to which the clamping unit is fixed and the simplification of its configuration, and is further possible to attempt the simplification and the weight saving of the transfer mechanism of the mounting board and the configuration as the FIMS system.

Further, at the clamping time, since the clamp member and the clamped portion surface mutually do not move out of the position in which they are brought into contact, the particles and the like caused by the friction of these members are sharply reduced. Further, the region in the engaging concave portion to which an access from the outside is difficult is a rear surface only of the clamped portion, which becomes a size of the smallest minimum, and therefore, the cleaning operation of this region can be easily performed.

In case the enlargement of the pod and the increase in its weight occurs, accompanied by this, the load generated by inertial at the pod moving time, the impact generated at the wafer transfer time and the like become much larger. In this case, the conventional clamping unit is relatively low in a capacity to fix the pod, and it is considered from now on that there arises a possibility of the mounting position of the pod being shifted by the application of some loads on the pod at the pod moving time and the like.

The present invention has been made in view of various problems expected to arise accompanied with the above described situation and the enlargement of the pod, and the object of the invention is to provide a pod clamping unit for eliminating a protrusion of the member required for the clamp from the mounting board surface, a pod corresponding to the unit, and a clamping mechanism or a clamping method using the unit when a pod clamp for fixing the pod to the FIMS system is performed. Further, the object of the present invention is to provide a pod clamping unit in which the situation where the sliding of the clamping unit and the clamped portion can occur is limited only to the contact time of both of them, a pod corresponding to the unit, and a clamping mechanism or a clamping method using the unit. Further, the object of the present invention is to provide a pod clamping unit in which the region difficult to access in the engaging concave portion is limited to the minimum possible, a pod corresponding to the unit and a clamping mechanism or a clamping method using the unit.

To solve the above-described problems, the pod clamping unit according to the present invention is a pod clamping unit for fixing the pod to a mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, and comprises: a pair of clamp members having a clamp arm, respectively, which expands in a direction approximately parallel to the bottom face of the pod and is capable of nipping the member at its top end portion; a clamp member drive mechanism which is connected to the pair of clamp members and performs the operation of the nipping and releasing the clamp arm; and a lifting mechanism for driving a pair of clamp members together with the clamp member drive mechanism and for moving up and down each clamp arm for the mounting board surface, wherein a clamp inclined portion having a predetermined angle for up and down directions is formed on the surface in reverse to the surface opposing to the pod at least in one within the clamp arms.

In the clamping unit, it is preferable that an inclined surface is formed on the top end portion of the clamp arm. Further, it is preferable that the clamp arm has each top end portion arranged to face with each other. Further, it is preferable that the clamp member drive mechanism is operated by pressurized air.

Further, to solve the above described problems, the pod clamping mechanism according to the present invention is a pod clamping mechanism comprising the pod clamping unit and the engaging concave portion provided in the bottom face of the pod, and the engaging concave portion comprises an engaging hole which is formed in an inner depth direction of the pod from the pod bottom face and has the inner depth capable of accommodating at least one from among the clamp arms in a predetermined depth, and a clamped portion which is bulged toward the center of the engaging hole as if to narrow its opening in the opening portion of the engaging hole and defines a size of the portion nipping the opening to be a width approachable, and the clamped portion is included in one side wall of the engaging concave portion and is nipped by each clamp arm, and further comprises a clamped inclined surface abuttable against a clamp inclined portion provided in one side wall of the engaging concave portion which is engageable with the clamp arm having the clamp inclined portion by each clamp arm driven in a direction to face to each other.

In the above described pot clamping mechanism, it is preferable that the clamped inclined surface is formed toward the interior of the engaging concave portion. Further, it is preferable that the mounting board surface has holes passable by each clamp arm, and the clamp member drive mechanism exists in the rear surface of the mounting board.

Further, to solve the above-described problems, the pod according to the present invention is a pod fixed to the mounting board by the pod clamping unit, and has an engaging concave portion comprising; an engaging hole having an inner depth capable of accommodating at least one from among clamp arms which are formed in an inner depth direction of the pod from the pod bottom face in a predetermined depth; and a clamped portion which is bulged toward the center of the engaging hole as if to narrow the opening in the opening portion of the engaging hole and defines a size of the portion nipping the opening to be a width approachable and is nipped by each clamp arm, and the clamped portion further comprises a clamped inclined surface abuttable against an inclined surface provided in one side wall of the engaging concave portion which is engageable with the clamp arm having the clamp inclined portion by each clamp arm driven in a direction to face to each other.

Further, to solve the above-described problems, the pod clamping method according to the present invention is a pod clamping method for fixing the pod to the mounting board in a pod opener, which has a pod main body to open at one side and a lid to open and close an opening, and at the same time, fixes the pod capable of accommodating the wafer in its interior on the mounting board surface and opens and closes the lid so that the inserting and taking out of the wafer into and from the interior of the pod is made possible, and comprises the steps of: mounting the pod on a predetermined position on the mounting board surface; protruding a plurality of clamp arms arranged downward below the mounting board surface to the mounting board surface in the engaging concave portion provided in the pod bottom face from the mounting board surface; and nipping the clamped portion provided in one side surface of the engaging concave portion by driving a plurality of clamp arms, and in the step of nipping the clamped portion, the clamped inclined surface rising by having a predetermined angle for the mounting board surface possessed by the clamped portion abuts against the inclined surface falling by having a predetermined angle possessed by at least one clamp arm within a plurality of clamp arms.

According to the present invention, the engaging concave portion provided in the interior of the pod has a depth approached by the clamp arm, and moreover, this may be a space only linearly moving to an engaging position. Consequently, it is possible to make the size of the concave space, in the interior of which the clamp member is driven, as small as possible, and the region difficult to access from the outside is only the rear surface of the clamped portion, which becomes the smallest minimum. Hence, the cleaning operation and the like of the space peripheral wall can be easily performed. Further, at the clamping time, since the clamp member and the clamped portion surface mutually do not move out of the position in which they are brought into contact with each other, the particles and the like caused by the friction of these members are sharply reduced.

Further, according to the present invention, at the stand-by time, the clamping unit has its whole structure existed always at the lower part from the mounting board surface. Consequently, when the pod is mounted on the mounting board, the positioning operation by using the positioning pin can be easily and smoothly performed. Further, at the pod fixing time, the abutment of each surface of the clamp member against each corresponding surface of the clamped portion alone basically completes the fixing operation. Consequently, the possibility of generating the particles and the like due to the sliding and the like of the members is sharply reduced.

Further, by using the air cylinder and the like, it is possible to configure a mechanism required to drive the clamp member from a simple and compact mechanism. Consequently, without changing the previous arrangement and the like of various mechanisms in the FIMS system sharply, it is possible to use the configuration according to the present invention.

As a result, the FIMS system using the clamping unit can be used also for the wafer accommodation container other than the FOUP such as the open cassette and the like.

Further, according to the present invention, the clamped portion in the pod is urged to the mounting board surface by the co-operation of the inclined surface provided in the clamp member and the inclined surface provided in the clamped portion. Thus, by the configuration for urging the clamped portion by inclined surfaces, a pod holding effect identical to the conventional clamping mechanism can be obtained. At the same time, according to the present invention, the clamped portion is nipped and fixed by a pair of clamp members. Even when, for example, the pod having a heavy weight is moved, a situation that might take place of the clamp portion being shifted due to its inertial and the like is sharply reduced. Consequently, the clamping unit according to the present invention is suitable as a clamping mechanism of the pod in which the substrate of the wafer and the like of much larger size is accommodated.

Further, to solve the above described problems, the pod clamping unit according to the present invention is a pod clamping unit for fixing the pod to the mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, and comprises: a clamp member opening and closing cylinder having an inner space in the upward end portion and capable of moving up and down vertically for the mounting board surface; and a plurality of clamp members accommodated in the inner space, wherein the inner space is communicated with a plurality of clamp member protruded openings arranged approximately in a radial pattern with a shaft of the clamp member opening and closing cylinder as a center in a flat surface approximately orthogonal to up and down directions of the clamp member opening and closing cylinder, and a plurality of clamp members are independent from the up and down movements of the clamp member opening and closing cylinder and a part thereof is driven so as to be protruded from the clamp member protruded opening.

In the above described pod clamping unit, it is preferable that the clamp member opening and closing cylinder is configured such that it holds an opening and closing piston communicating with the lower part of the inner space, and pushes out the clamp member toward the clamp member protruded opening from the inner space by the lifting operation toward the inner space of the opening and closing piston. Further, in the above described pod clamping unit, it is preferable that the clamp member opening and closing cylinder is supported by a lifting piston held in the inner space provided in a clamp member lifting cylinder arranged in the lower part of the opening and closing cylinder, and performs an up and down movement for the mounting board surface accompanied with the up and down movement of the lifting piston. Further, in the pod clamping unit, it is preferable that the clamp member is made of a metal ball.

Further, to solve the above described problems, the pod clamping mechanism according to the present invention is a pod clamping mechanism comprising the pod clamping unit and the engaging concave portion provided in the bottom face of the pod, wherein the engaging concave portion comprises: an engaging hole having an inner depth capable of accommodating the upper portion of the clamp member opening and closing cylinder in a predetermined depth and an inner width capable of accommodating the clamp member opening and closing cylinder in a protruded state of the clamp member; and a clamped portion which is protruded toward the center of the engaging hole as if to narrow the opening in the opening portion of the engaging hole with the opening approachable by the clamp member opening and closing cylinder and is defined to be a width unapproachable by the clamp member opening and closing cylinder in a protruded state of the clamp member.

In the above described pod clamping mechanism, it is preferable that a hole passable through by the upper end portion of the clamp member opening and closing cylinder is formed in the mounting board surface.

Further, to solve the above described problems, the pod according to the present invention is a pod which comprises a pod main body to open at one side surface thereof and a lid to open and close an opening, and at the same time, is capable of accommodating in its interior of the wafer, and has an engaging concave portion used when mounted and fixed to the mounting board in the pod opener which makes it possible to insert and take out of the wafer into and from the interior of the pod by opening and closing the lid, wherein the engaging concave portion comprises: an engaging hole, which is capable of accommodating a clamping unit in the pod opener in a predetermined depth, and is formed in an inner direction from the bottom face of the pod having an inner depth capable of performing an clamping operation in its interior for fixing the pod to the mounting board by the clamping unit; and a clamped portion, which is protruded toward the center of the engaging hole as if to narrow the opening in the opening portion of the engaging hole with the opening portion approachable by the clamping unit, and at the same time, is defined to be a width unapproachable in a state of the clamping operation being performed by the clamping unit, and the end portion of the deepest side of the engaging concave portion, which is the periphery of the opening portion in the clamped portion, has an inclined surface which narrows the opening portion as proceeding toward the opening side.

Further, to solve the above described problems, the pod clamping method according to the present invention is a pod clamping method for fixing the pod to the mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, and comprises the steps of: mounting the pod on a predetermined position on the mounting board surface; allowing the clamp member opening and closing cylinder arranged in the lower part of the mounting board surface to approach to the engaging concave portion provided in the pod bottom face from the mounting board surface; protruding a part of the clamp member from the opening portion provided approximately in a radial pattern with a shaft of the clamp member opening and closing cylinder as a center in the clamp member opening and closing cylinder top end portion; and pulling back the clamp member opening and closing cylinder to the surface side of the mounting board in a protruded state of the part of the camp member.

According to the present invention, the engaging concave portion provided in the interior of the pod has a depth approached by the top end portion only of the clamping unit comprising a coaxial air cylinder, and moreover, this may be a space only capable of partially accommodating a metal ball accommodated in the top end portion. Consequently, it is possible to make the size of a concave space, where the clamp member is driven in its interior, as small as possible, and the region difficult to access from the outside in the engaging concave portion is only the rear surface of the clamped portion which becomes the smallest minimum. Hence, the cleaning operation and the like of the space peripheral wall can be easily performed. Further, at the clamping time, since there is little likelihood that the clamp member and the clamped portion surface mutually do not move out of the position in which they are brought into contact with each other, the particles and the like caused by the friction of these members are sharply reduced.

Further, according to the present invention, at the stand-by time, the clamping unit has its whole structure existed always at the lower part from the mounting board surface. Consequently, when the pod is mounted on the mounting board, the positioning operation by using the positioning pin can be easily and smoothly performed. Further, at the pod fixing time, the abutment of the each surface of the clamp member against each corresponding surface of the clamped portion alone basically completes the fixing operation. Consequently, the possibility of generating the particles and the like due to the sliding and the like of the members is sharply reduced.

Further, by using the air cylinder and the like, it is possible to configure a mechanism required to drive the clamp member from a simple and compact mechanism. That is, in the present invention, being different from the patent document 4, since the clamping mechanism is configured by using a plurality of compact cylinders with rods expandable and contactable in an uniaxial direction only, it is possible to make the outer shape smaller as the clamping unit, and moreover, to reduce its weight smaller also. Consequently, without sharply changing the previous arrangement and the like of various mechanisms in the FIMS system, it is possible to use the configuration according to the present invention. As a result, it is possible to attempt the weight saving of the mounting board to which the clamping unit is fixed and the simplification of its configuration, and is further possible to attempt the simplification and the weight saving of the transfer mechanism of the mounting board and the configuration as the FIMS system.

Further, according to the present invention, at the pod fixing time, a pair of metal balls gives to the pod a force to press the pod toward the mounting board surface, and at the same time, gives to the pod loads in two respective opposed directions with relation to an approximate parallel direction with the pod bottom face. That is, according to the present invention, not only the effect of pressing the pod to the mounting board surface by the conventional clamping mechanism, but also a force capable of opposing to the attempt of the pod to displace in a horizontal direction can be obtained from the present unit. Hence, for example, even when a pod having a heavy weight is moved, a situation that might take place of the clamp portion being shifted due to its inertial and the like is sharply reduced. Consequently, the clamping unit according to the present invention is suitable as a clamping mechanism of the pod in which the substrate of the wafer and the like of much larger size is accommodated.

Further, the present invention has been made in view of the above described situation, and the object of the invention is to provide a pod clamping unit and a clamping mechanism or a clamping method using the unit without protruding the member required for the clamp from the mounting board surface when the pod clamping is performed for fixing the pod to the FIMS system. Further, the object of the present invention is to provide a clamping mechanism or a clamping method using a pod clamping unit and a clamping mechanism or a clamping method using the unit in which a situation where a sliding between the clamping unit and the clamped portion that might take place is only at the contact time of both of them. Further, the object of the present invention is to provide a pod clamping unit and a clamping mechanism or a clamping method using the unit in which the region difficult to access in the engaging concave portion is limited to the smallest possible minimum.

To solve the above described problems, the pod clamping unit according to the present invention is a pod clamping unit for fixing the pod to the mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, and comprises: a clamp member opening and closing cylinder capable of moving up and down vertically for the mounting board surface; a pair of clamp members having the one end portion rotatably supported by the clamp member opening and closing cylinder and having a clamp portion at the other end, and moreover, having a slide pin embedded in a direction orthogonal to its expanded surface; and a link having a long hole with the long hole inserted with each slide pin in a pair of clamp members, wherein the pair of clamp members is driven through a slide pin by driving the link, and the clamp member opening and closing cylinder is unable to descend for a predetermined amount when the clamp member takes a predetermined clamping posture.

In the above described pod clamping unit, the clamp member opening and closing cylinder holds an opening and closing piston capable of moving up and down in its axial direction, and it is preferable that the link is connected to the opening and closing piston and is driven according to the up and down operation of the opening and closing piston. Further, in the above described pod clamping unit, the clamp member opening and closing cylinder is supported by a lifting piston held in the inner space provided in a clamp member lifting cylinder arranged in its lower part, and it is preferable that the clamp member taking a clamping posture moves between a clamp position and a non-clamp position accompanied with the up and down movement of the lifting piston. Further, in the above described pod clamping unit, it is preferable that the clamp member comprises a straight-line portion embedded with the slide pin; a bending portion connected to one end of the straight-line portion to bend in a predetermined direction so as to expand, and at the same time, rotatably supported by the clamp member opening and closing cylinder; and a clamp portion connected to the other end of the straight-line portion and expanded approximately in the same direction as the bending portion.

Further, to solve the above described problems, the pod clamping mechanism according to the present invention is a pod clamping mechanism comprising the pod clamping unit and an engaging concave portion provided in the bottom face of the pod, wherein the engaging concave portion comprises an engaging hole having an inner depth capable of accommodating the clamp portion in a predetermined depth when the clamp member is in a clamping posture; and an clamped portion which is protruded toward the center of the engaging hole as if to narrow the opening in the opening portion of the engaging hole and which defines the opening to be a width approachable only in the process of taking a clamping posture by the driving of the link by the clamp member.

In the above described pod clamping mechanism, a hole having an approximate same size as the opening portion is formed in the mounting board surface, and it is preferable to arrange a configuration in which the clamp member approaches to the engaging hole from the stand-by position in the mounting board through a hole.

Further, to solve the above described problems, the pod clamping method according to the present invention is a pod clamping method for fixing the pod to the mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, wherein the pod clamping method comprises the steps of: mounting the pod on a predetermined position on the mounting board surface; protruding a pair of rotatable clamp members arranged downward by the mounting board and connected by the link to the interior of the engaging concave portion provided in the pod bottom face from the mounting board surface by rotating it so as to take a clamping posture; and engaging the clamped portion and the clamp member which move a pair of clamp members put in the clamping posture in a predetermined direction and defines the opening portion of the engaging concave portion.

According to the present invention, the engaging concave portion provided in the interior of the pod has a depth approached by the top end portion only of the clamping unit comprising the coaxial air cylinder, and moreover, this depth may be a space only capable of partially accommodating the metal ball accommodated in the top end portion. Consequently, it is possible to make the size of a concave space, where the clamp member is driven in its interior, as small as possible, and the region difficult to access from the outside in the engaging concave portion is only the rear surface of the clamped portion, which becomes the smallest minimum. Hence, the cleaning operation and the like of the space peripheral wall can be easily performed. Further, at the clamping time, after being put into the clamping posture by a certain drive system, the clamp member is driven in one direction only by another drive system to abut against the clamped portion so as to perform the clamping operation while being in such a posture. Consequently, there is little possibility that the clamp member and the surface of the clamped portion mutually move out of the position at which they are brought into contact with each other, and the possibility of the particles and the like being generated by the friction of these members is reduced.

Further, according to the present invention, at the stand-by time, the clamping unit has its whole structure existed always at the lower part from the mounting board surface. Consequently, when the pod is mounted on the mounting board, the positioning operation by using the positioning pin can be easily and smoothly performed. Further, at the pod fixing time, the abutment of the each surface of the clamp member against each corresponding surface of the clamped portion alone basically completes the fixing operation. Consequently, the possibility of generating the particles and the like due to the sliding and the like of the members is sharply reduced.

Further, by using the air cylinder and the like, it is possible to configure a mechanism required to drive the clamp member from a simple and compact mechanism. That is, in the present invention, being different from the conventional art, since the clamping mechanism is configured by using a plurality of compact cylinders with rods expandable and contactable in an uniaxial axis direction only, it is possible to make the outer shape smaller as the clamping unit, and moreover, to reduce its weight smaller also. Consequently, without sharply changing the previous arrangement and the like of various mechanisms in the FIMS system, it is possible to use the configuration according to the present invention. As a result, it is possible to attempt the weight saving of the mounting board to which the clamping unit is fixed and the simplification of its configuration, and is further possible to attempt the simplification and the weight saving of the transfer mechanism of the mounting board and the configuration as the FIMS system.

Further, to solve the above-described problem, the pod clamping unit according to the present invention is a pod clamping unit for fixing the pod on a mounting board in a pod opener, which has a pod main body to open at one side thereof and a lid to open and close an opening, and at the same time, fixes the pod capable of accommodating the wafer in its interior on the mounting board surface and opens and closes the lid so that the inserting and taking out the wafer into and from the interior of the pod is made possible, and comprises: an approximate bar-shaped lifting piston capable of moving up and down for the mounting board surface; a clamp pin cylinder fixed to the upper end portion of the lifting piston; and an approximate bar-shaped clamp member accommodated in the clamp pin cylinder and expandable and contactable in a direction orthogonal to up and down directions, wherein the expanding and contracting operation of the clamp member is executable only when the lifting piston exists in its lifting position and the vicinity thereof.

In the above described pod clamping unit, the clamp member is accommodated by a space capable of accommodating a part of the clamp member provided in the clamp pin cylinder, and it is preferable that the expansion and contraction of the clamp member are made by the introduction and discharge of a pressure medium into the space. Further, in the above described pod clamping unit, the lifting piston has its non-accommodated portion expandably supported up and down by the lifting piston accommodating the under part of the lifting piston, and it is preferable that the lifting piston pin cylinder is fixed to the mounting board.

Further, to solve the above described problems, the pod clamping mechanism according to the present invention is a pod clamping mechanism comprising the pod clamping unit and the engaging concave portion provided in the bottom face of the pod, wherein the engaging concave portion comprises: an engaging hole having an inner depth capable of accommodating the clamp pin cylinder in a predetermined depth and an inner width capable of accommodating the clamp pin cylinder in a protruded state of the clamp member; and a clamped portion, which is protruded toward the center of the engaging hole as if to narrow the opening in the opening portion of the engaging hole with the opening approachable by the clamp pin cylinder and is defined to be a width unapproachable by the clamp pin cylinder in a state of the clamp pin cylinder being protruded.

In the above described pod clamping mechanism, it is preferable that a hole passable through by the clamp pin cylinder is formed on the mounting board surface.

Further, to solve the above described problems, the pod clamping method according to the present invention is a pod clamping method for fixing the pod to the mounting board in a pod opener which has a pod main body to open at one side thereof and a lid to open and close an opening, and at the same time, fixes the pod capable of accommodating the wafer in its interior on the mounting board surface and opens and closes the lid so that the inserting and taking out of the wafer into and from the interior of the pod is made possible, wherein the pod clamping method comprises the steps of: mounting the pod on a predetermined position on the mounting board surface; allowing the clamp pin cylinder arranged at the lower part from the mounting board surface to approach to the engaging concave portion provided in the pod bottom face from the mounting board surface; protruding a part of the clamp member accommodated in the clamp pin cylinder to a predetermined direction; and pulling back the clamp pin cylinder in a protruded state of the clamp member to the mounting board surface side.

According to the present invention, the engaging concave portion provided in the interior of the pod has a depth approached by the top end portion only of the clamping unit comprising a coaxial air cylinder, and moreover, this depth may be a space only capable of partially accommodating the clamp piston accommodated in the top end portion. Consequently, it is possible to make the size of the concave space, in the interior of which the clamp member is driven, as small as possible, and the region difficult to access from the outside in the engaging concave portion is only the rear surface of the clamped portion, which becomes the smallest minimum. Hence, the cleaning operation and the like of the space peripheral wall can be easily performed. Further, at the clamping time, after being put into the clamping posture by a certain drive system, the clamp member is driven in one direction only by another drive system to abut against the clamped portion so as to perform the clamping operation while being in such a posture. Consequently, there is little possibility that the clamp member and the surface of the clamped portion mutually move out of the position at which they are brought into contact with each other, and the possibility of the particles and the like being generated by the friction of these members is reduced.

Further, according to the present invention, at the stand-by time, the clamping unit has its whole structure existed always at the lower part from the mounting board surface. Consequently, when the pod is mounted on the mounting board, the positioning operation by using the positioning pin can be easily and smoothly performed. Further, at the pod fixing time, the abutment of the each surface of the clamp member against each corresponding surface of the clamped portion alone basically completes the fixing operation. Consequently, the possibility of generating the particles and the like due to the sliding and the like of the members is sharply reduced.

Further, by using the air cylinder and the like, it is possible to configure a mechanism required to drive the clamp member from a simple and compact mechanism. That is, in the present invention, being different from the patent document 4, since the clamping mechanism is configured by using a plurality of compact cylinders with rods expandable and contactable in an uniaxial direction only, it is possible to make the outer shape smaller as the clamping unit, and moreover, to reduce its weight smaller also. Consequently, without sharply changing the previous arrangement and the like of various mechanisms in the FIMS system, it is possible to use the configuration according to the present invention. As a result, it is possible to attempt the weight saving of the mounting board to which the clamping unit is fixed and the simplification of its configuration, and is further possible to attempt the simplification and the weight saving of the transfer mechanism of the mounting board and the configuration as the FIMS system.

BRIEF DESCRIPTION OF THE DRAWINGS

FIG. 2A relates to the clamping mechanism shown in FIG. 1, and is a view showing its operational state;

FIG. 2B relates to the clamping mechanism shown in FIG. 1; and is a view showing its operational state;

FIG. 20 is a side view including the partial section of the main elements in case of using a clamping unit according to a third embodiment of the present invention for the FIMS system shown in FIG. 3;

DESCRIPTION OF THE PREFERRED EMBODIMENTS

First Embodiment

Figure 1:
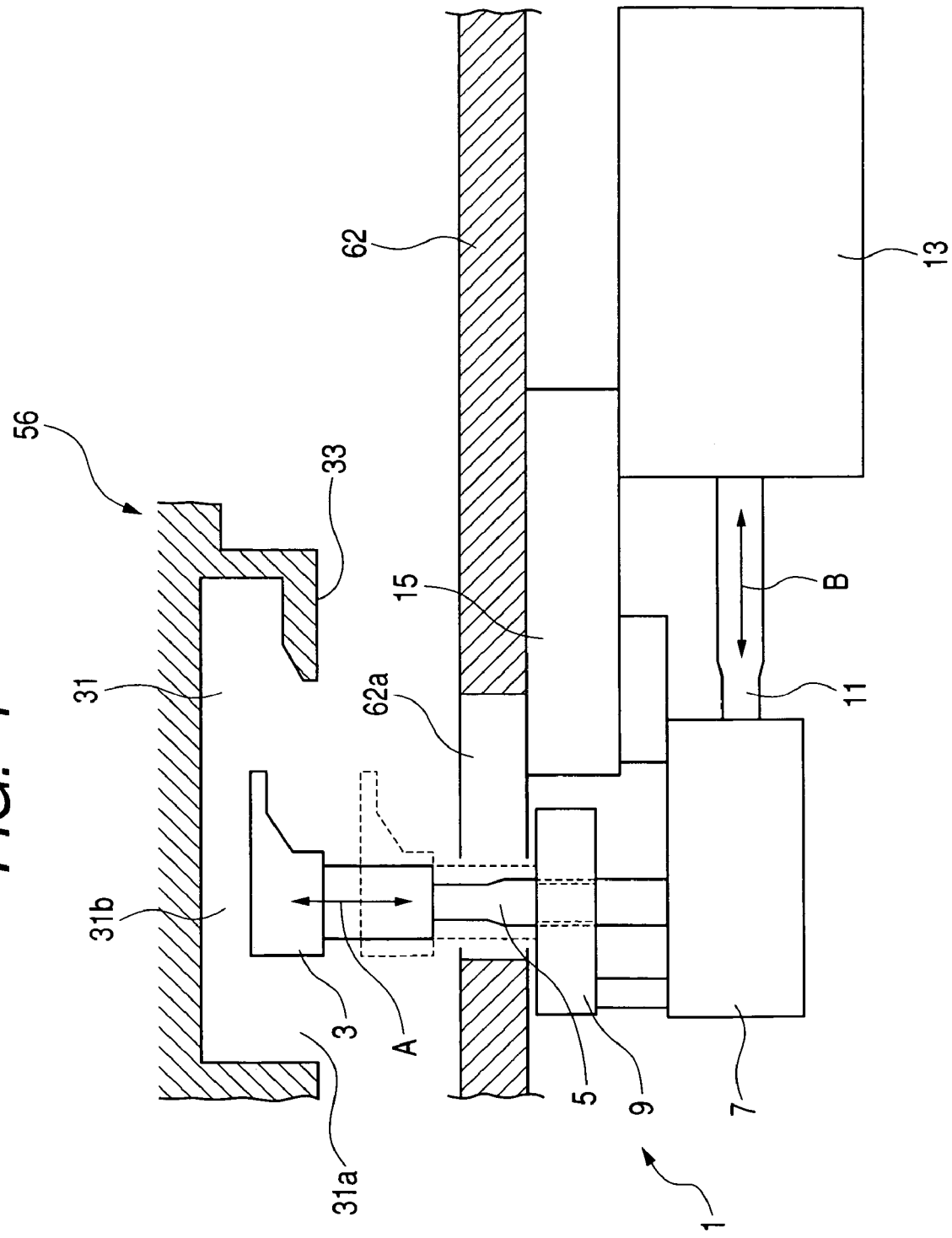
FIG. 1 relates to a clamping mechanism according to a first embodiment of the present invention, and is a side view showing its schematic configuration.

A first embodiment of a clamping mechanism according to the present invention will be described below with reference to the drawings. FIG. 1 is a view showing a schematic configuration of the embodiment of the clamping mechanism according to the present invention. The clamping mechanism according to the present invention consists of an engaging concave portion 31 provided in the under surface of a pod main body 56 and a clamping unit 1 arranged in a FIMS system 90. The engaging concave portion 31 provided in the bottom face of the pod main body 56 comprises an engaging hole 31*b*, an opening 31*a* of the engaging hole, and an clamped portion 33 neighbored to the engaging hole 31*b* and protruded toward the center of the engaging concave portion 31 as if to cover a part of the engaging hole 31*b*.

In the present embodiment, the depth of the engaging hole 31*b* is an inner depth capable of accommodating a clamp member to be described later in a predetermined depth, and at the same time, this depth is an inner depth movable in a first direction approximately parallel to a mounting board surface. The pod main body 56 is supported by an unillustrated positioning pin on a mounting board 62 and an approximate flat pod accepting surface, and with respect to the clamping mechanism vicinity, as illustrated in the drawing, the under surface of the pod main body 56 is maintained in a spaced apart state from the surface of the mounting board 62.

The clamping unit 1 comprises a clamp member 3, a vertical cylinder rod 5, a vertical cylinder 7, a vertical movement guide 9, a horizontal cylinder rod 11, a horizontal cylinder 13, and a horizontal cylinder guide 15. The clamp member 3 is fixed to the upper end portion of the vertical cylinder rod 5 which penetrates an opening 62*a* formed in the mounting board 62 and is expandable and contactable in a vertical direction (an arrow mark shown by A in the drawing). Further, the vertical cylinder rod 5, when mounting the pod main body 56 on the mounting board 62 in an initial position (position shown by a dotted line), maintains the clamp member 3 at a position where the under surface of the pod main body 62 and the clamp member 3 are not in contact.

The under end portion of the vertical cylinder rod 5 is supported by the vertical cylinder 7 so as to be expandable and contactable, and is defined in its expanding direction by the vertical movement guide 9 fixed to the vertical cylinder 7 main body. The vertical cylinder 7 and the vertical movement guide 9 are arranged in the interior of the bottom space of the mounting board 62. The vertical cylinder 7 is, moreover, fixed to one end portion of the horizontal cylinder rod 11 expandable and contactable in a direction (an arrow mark direction shown by B in the drawing) approximately parallel to the bottom face of the pod main body. The other end portion of the horizontal cylinder rod 11 is supported by the horizontal cylinder 13, and is defined in its expandable and contactable direction by the horizontal movement guide 15 fixed to the horizontal cylinder 13 or the mounting board 62. Further, the horizontal cylinder 13 is fixed for the mounting board 62.

Being composed of these configurations, the clamp member 3, in its initial state, stands by at a position where there is no possibility of contacting the under surface of the pod main body 56 and, at a clamping operation time, is enabled to drive independently in a B (vertical) direction and an A (horizontal) direction. The horizontal direction and the vertical direction described here are the directions conveniently defined for the bottom face of the pod, and it is preferable that they are conveniently decided as first and second directions going straight, respectively according to the shape and the like of the pod.

Next, an actual clamping operation by these clamping mechanisms will be described with reference to FIGS. 1 and 2A and 2B. The arrangement of the clamp member 3 in a state where the pod main body 56 is mounted on the mounting board 62 and its positioning is performed by an unillustrated positioning pin and the like, as shown by the dotted line in FIG. 1, is positioned at the lower part from the under surface of the pod main body 56. At the clamping operation time, the vertical cylinder rod 5 is expanded by the vertical cylinder 7, and the clamp member 3 protrudes and approaches into the interior of the engaging concave portion 31. Subsequently, the horizontal cylinder rod 11 is shrunk by the horizontal cylinder 13, and the clamp member 3 together with the vertical cylinder 7 and the like are moved in the direction where the clamped portion 33 is arranged. When the clamp portion 3 reaches a predetermined horizontal position engageable with the clamped portion 33, this movement is stopped. This state is shown in FIG. 2A.

After the movement of the clamp member 3 and the like by the horizontal cylinder 13 is completed, the vertical cylinder rod 5 is shrunk. This shrinking operation is stopped when the clamp portion 3a of the clamp member 3 and the engaging surface 33a of the clamped portion 33 are contacted and engaged. It is preferable that this stopping operation is such that, by using a cylinder incapable of driving more than a predetermined load as the vertical cylinder 7, not only the engagement but also the driving is automatically stopped. By giving this predetermined load by the vertical cylinder 7 between the clamp portion 3a and the engaging surface 33a, the pod main body 56 is fixed to the mounting board 62 accompanied with the predetermined load.

The shapes of the clamp member 3 and the clamped portion 33 in the above described embodiment are not limited to those illustrated, nor limited to those provided that they are shaped and arranged in such a manner as to make a point contact accompanied with an appropriate load and yet not to cause a sliding and the like. Further, since it is easy to avoid an addition of an over load, the drive of each member shall be by an air operation system using a cylinder. However, the present invention is not limited to the air operation system, but the operation system comprising various fibrillation systems easy to make a control of loading capacity, a position control and the like may be used.

Figure 3:
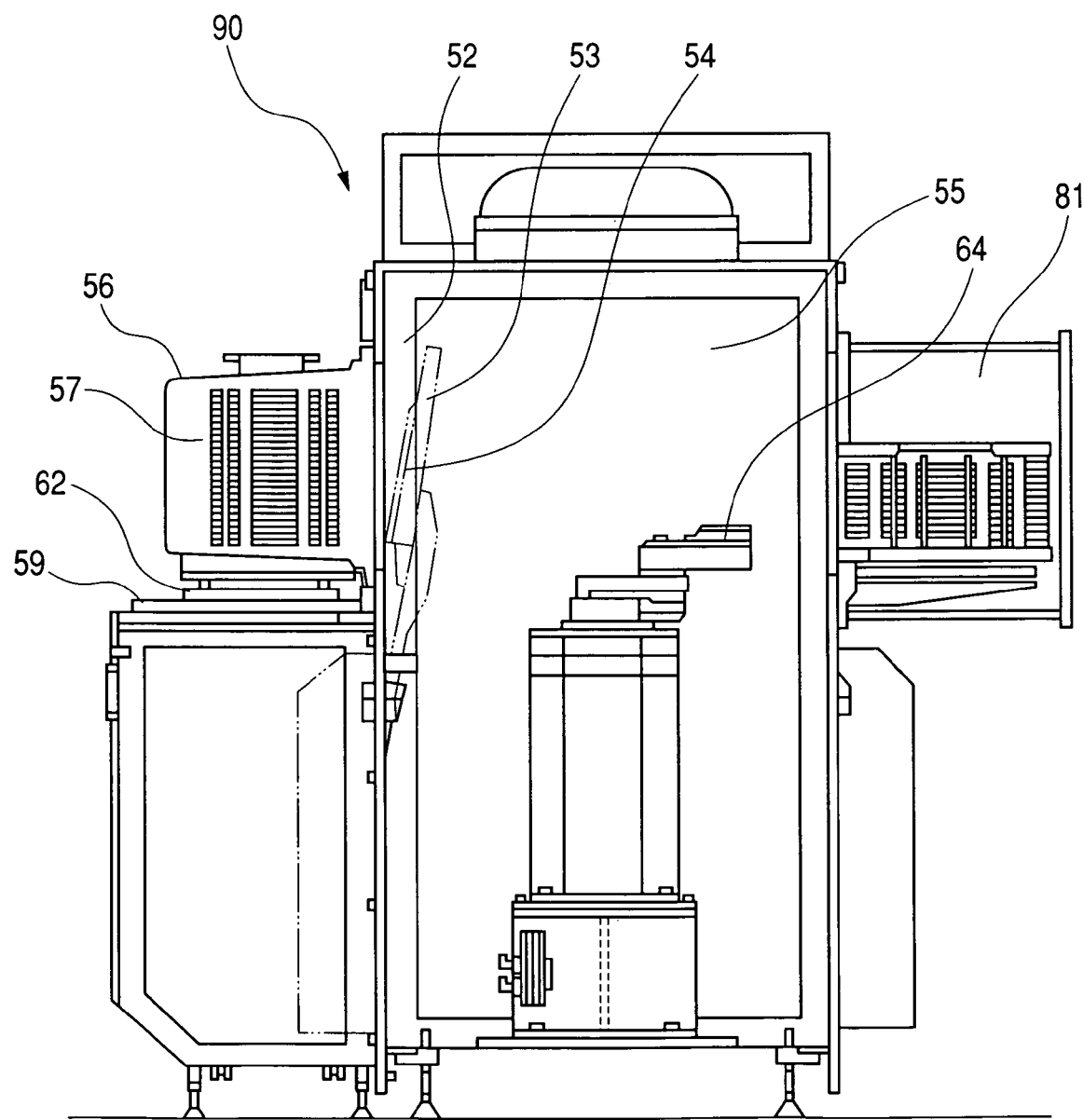
FIG. 3 is a schematic diagram showing a FIMS system and the like using the clamping mechanism according to the present invention.

A FIMS system actually having a clamping mechanism according to the present invention, a pod to be mounted on this system, a wafer transfer device attached with the FIMS system, and the like will be described below by using FIGS. 3 and 4 as an embodiment of the present invention. FIG. 3 shows a schematic configuration of the system performing the transfer of a wafer and the like from the pod to a processing unit including the whole structure thereof. The system as shown in FIG. 1 consists of a micro space 55 maintained in a highly clean state where a wafer transfer robot 64 is arranged in its center, a substrate receiving state 81 at the side of an unillustrated processing unit provided in the one wall of the space 55, and the FIMS system 90 provided in the other wall of the space 55.

The FIMS system 90 comprises the other wall of the micro space 55, an opening 52, a door 53, and the mounting board 62. The opening 52 is provided in the other wall of the micro space 55. The door 53 is capable of closing the opening 52 from the interior of the space 55 and moving the opening 52 downward by an unillustrated drive mechanism when the opening 52 is put into an opened state. The mounting board 62 can allow the open surface of the pod 56 to sit in a correct position for the opening 52 so as to be mounted on the board, and the pod 56 can be approached to or spaced apart from the opening 52 by a mounting board drive unit 65 (see FIG. 4). The pod 56 vertically accommodates in its interior a plurality of wafers 57 spaced apart at equal intervals. A lid 54 is fixed to the open surface of the pod 56 to close this surface, and this lid 54 is held in the door 53 and moves downward together with the door 53 when the wafer is inserted to and taken out from the FIMS system.

Figure 4:
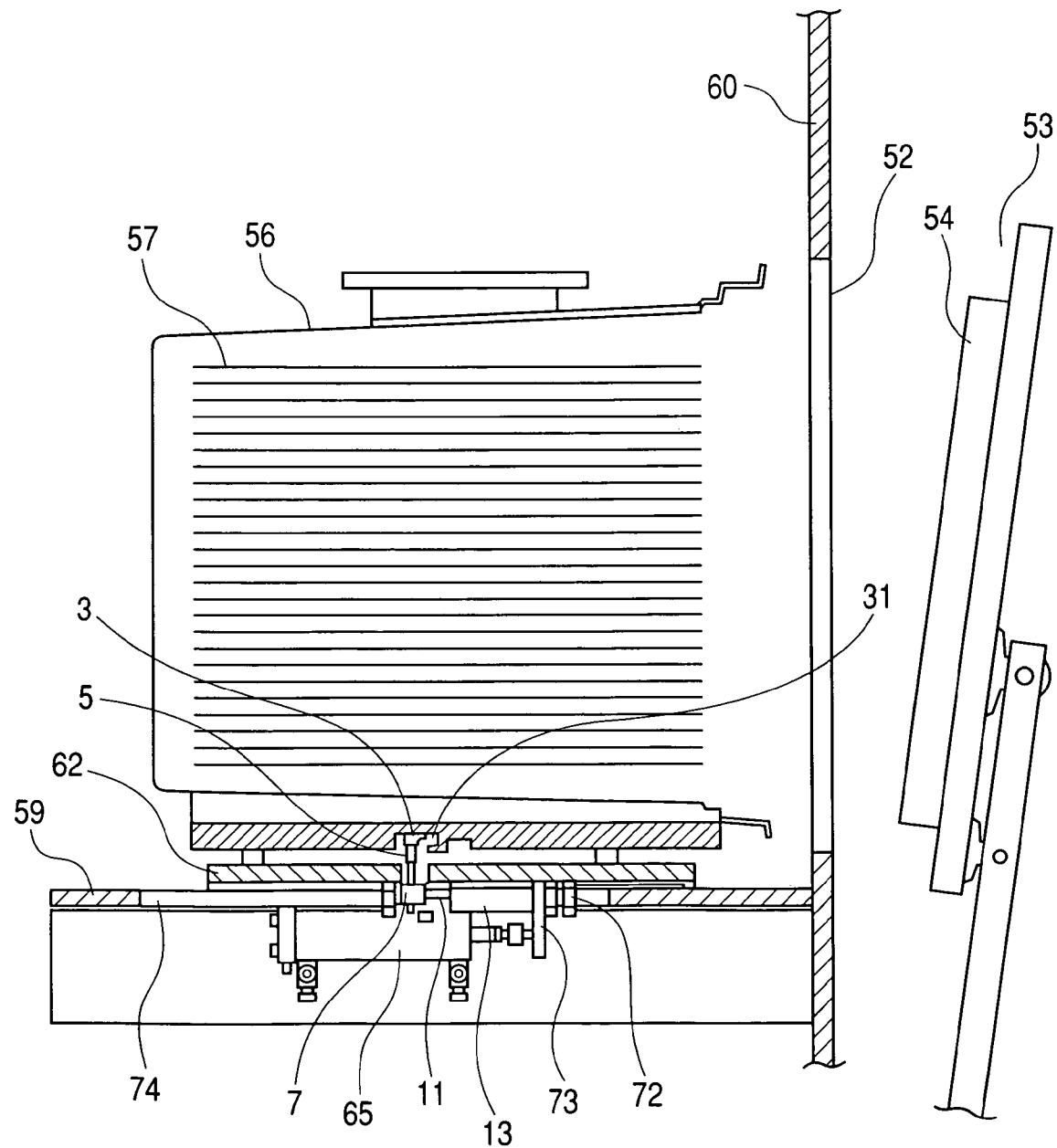
FIG. 4 is a side view including partial section of main elements of the FIMS system shown in FIG. 3.

The mounting board 62, the opening 52 and the door 53 in the FIMS system 90 and an approximate schematic sectional state of the configuration belonging to these elements are shown in FIG. 4. The mounting board 62 is arranged on a table 59 integrated with a wall 60 formed with the opening 52. The mounting board 62 is connected to an air cylinder 65 through a support member 73. The air cylinder 65 is fixed to a table 59 in the interior of a rectangular hole 74 provided in the table 59, and is used for allowing the mounting table 62 to approach to or to be spaced apart from the wall 60. The moving distance in a direction of the wall 60 of the mounting board 62 is defined by the abutment of an abutting member 72 against the end portion of the rectangular hole 74.

As described above, the horizontal cylinder 13 is fixed to the under surface of the mounting board 62. Since the arrangement and relationship of each element configuring the horizontal cylinder and other clamping mechanisms are not particularly different from the content described in the embodiment, the description thereof will be omitted here. By using the clamping mechanisms comprising the configuration as described above, there will be no protruded member existing on the surface of the mounting board 62 except for the positioning pin. Consequently, it is possible to eliminate an unnecessary contact between the pod under surface and the mounting board surface and the wear and the like of the pod bottom portion accompanied with this contact. Further, with the mounting board surface made approximately flat, it is possible also to deal with an open cassette.

Second Embodiment

Figure 5:
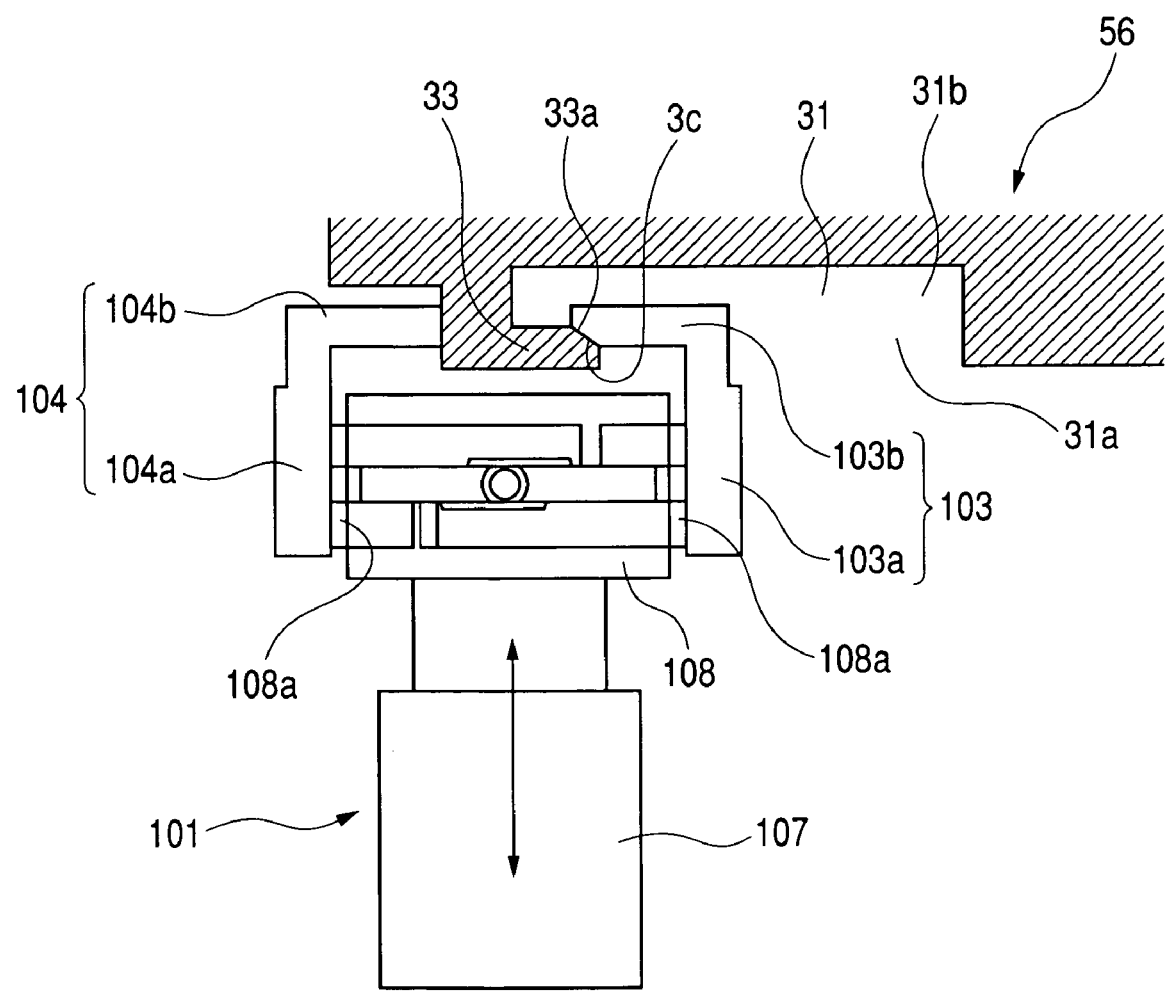
FIG. 5 relates to the clamping unit according to the embodiments of the present invention, and is a side view showing its schematic configuration.

A second embodiment of the clamping mechanism according to the present invention will be described below with reference to the drawings. The same configuration as the configuration described in the first embodiment will be described by using the same reference numerals. FIG. 5 is a view showing a schematic configuration of the embodiment of the clamping mechanism according to the present invention. The clamping mechanism according to the present invention consists of an engaging concave portion 31 provided in the under surface of a pod main body 56 and a clamping unit 1 arranged in a FIMS system 90. The engaging concave portion 31 provided in the bottom face of the pod main body 56 comprises a engaging hole 31b, an opening 31a of the engaging hole, and a clamped portion 33 neighbored to the engaging hole 31b and protruded toward the center of the engaging concave portion 31 as if to cover a part of the engaging hole 31b. On the top end of the clamped portion 33, a clamped inclined surface 33a is formed in a shape to cut off an inner most angle portion of the engaging concave portion 31, that is, as if to rise up from its top end portion at a predetermined angle.

In the present embodiment, the depth of the engaging hole 31b has an inner depth capable of accommodating the clamp member so that one of a pair of clamp members to be described later approaches to the engaging hole 31b and reaches a position engageable with the clamped portion 33. At the same time, the engaging hole 31b has an inner width in which the clamp member can move to a second direction approximately in parallel to the mounting board surface to engage with the clamped member. That is, in the present embodiment, the engaging concave portion 31 has the engaging hole 31b which is formed from the bottom face of the pod 56 in a direction to the interior of the pod 56. This engaging hole 31b has an inner depth capable of accommodating at least one among the clamp arms in a predetermined depth. Further, in the opening portion of the engaging hole 31b, the clamped portion 33 protrudes toward the center of the engaging hole 31b as if the narrow the opening, and defines the opening 31a to be a width approachable by a nipping portion in the clamp arm. The pod main body 56 is supported by an unillustrated positioning pin and an approximate flat pod receiving surface on the mounting board 62.

A clamping unit 101 comprises a fist clamp member 103, a second clamp member 104, a lifting cylinder 107, and an air chuck mechanism 108. The first clamp member 103 comprises an approximate bar-shaped first support portion 103a and a first clamp arm 103b. The first support portion 103a is connected to the air chuck mechanism 108, and expands to a lifting direction (direction shown by an arrow mark A in the drawing). The first clamp arm 103b expands from the upper end portion of the support portion 103a to a direction vertical to the lifting direction which is an axle center direction of the air chuck mechanism, that is, to a direction approximately in parallel to the bottom face of the pod. The second clamp member 104 similarly comprises a second support portion 104a and a second clamp arm 104b, and these basic configurations are the same as those of the first clamp member 103.

The first clamp arm 103b and the second clamp arm 104b are on the same straight line, and are arranged in a direction to oppose to each other. Further, in the top end portion of the first clamp arm 103b, there is formed a clamp inclined portion 103c in a shape to cut off an angle portion downward from a lifting direction. To be more precise, in the surface opposite to a flat surface opposing to the pod bottom face in the clamp arm, there is formed a clamp inclined portion 103c as an inclined surface in a shape to rise up from the top end of the clamp arm at a predetermined angle. The inclined angle of the clamp inclined portion 103c approximately matches the inclined angle of the clamped portion inclined surface 33a. Although it is preferable that the clamp inclined portion 103c is formed in the top end portion of the first clam arm 103b, it may be provided in other than the top end portion. The top end portion of the second clamp arm 104b has a surface shape capable of abutting against the wall surface of the portion where the clamped portion 33 is connected to the pod main body 56.

The air chuck mechanism 108 allows a link arm 108a protruded in a direction vertical to the lifting direction in both side surfaces to perform expanding and contracting operations by supply and discharge operations of an unillustrated pressurized air. The link arm 108a is connected to the first support portion 103a and the second support portion 104a, respectively in its top end portion. According to the expanding and contracting operations of the link arm 108a, the first clamp arm 103b and the second clamp arm 104b perform an isolating and approaching operation on the same straight-line state. The air chuck mechanism 108 is fixed and supported by a lifting cylinder 107 fixed to the mounting board 62 to be described later, and by this cylinder, lifting operations of the air chuck mechanism 108 and the first and second clamp arms 103 and 104 are performed.

The lifting cylinder 107 and the air chuck mechanism 108 are arranged within the bottom space of the mounting board 62. The first and second clamp members 103 and 104 move between the upper surface and the lower surface of the mounting board through an opening 62a formed in the mounting board 62. The lifting cylinder 107 is in a state of moving downward in the initial position prior to mounting the pod. Consequently, the first and second clamp arm 103b and 104b stand by at a position where the pod main body 56 bottom face and the clamp member 103 are not in contact, that is, at a position lower than the surface of the mounting board 62. Being composed of these configurations, the first and second clamp members 103 and 104, in the initial sate, stand by at a position where there is no likelihood of the contact between the bottom face of the pod main body 56 and the clamp member 103, and only at the clamping operation time, can start operating by protruding the arms on the mounting board surface. The up and down directions or the like described here are the directions conveniently defined strictly based on the lifting direction, and it is desirable that these directions be appropriately set as a first direction and the like according to the shape and the like of the pod.

Figure 6A:
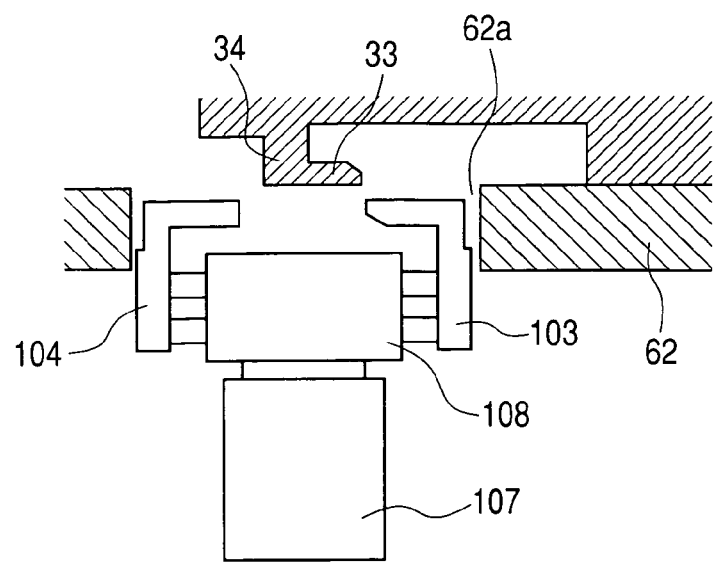
FIG. 6A is a view showing the operational state of the clamping unit shown in FIG. 5.
Figure 6B:
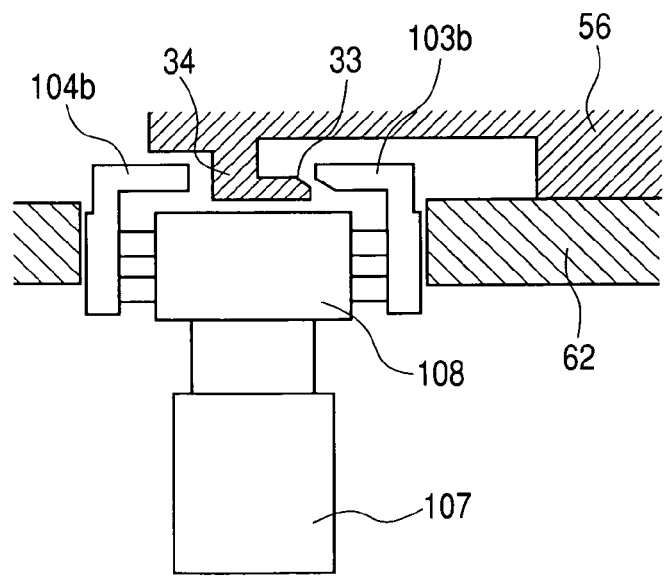
FIG. 6B is a view showing the operational state of the clamping unit shown in FIG. 5.
Figure 6C:
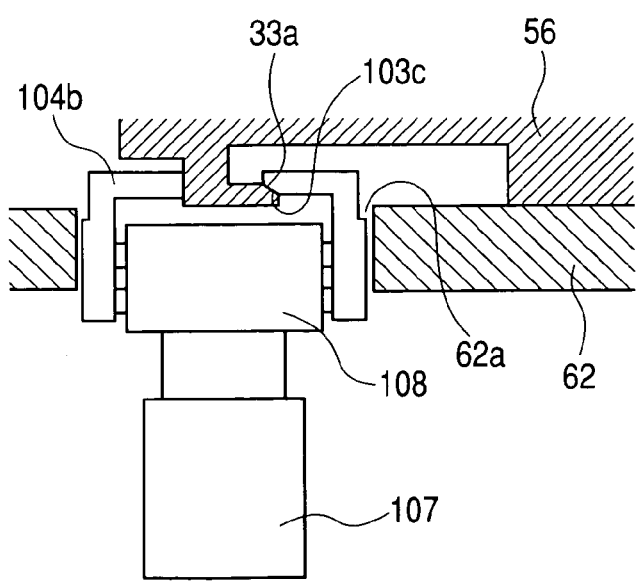
FIG. 6C is a view showing the operational state of the clamping unit shown in FIG. 5.

Next, an actual clamping operation by these clamping mechanisms will be described with reference to FIGS. 5 and 6A to 6C. The arrangement of the first and second clamp members 103 and 104 in a state where the pod main body 56 is mounted on the mounting board 62 and its positioning is performed by an unillustrated positioning pin is, as shown in FIG. 6A, positioned at the lower part from the under surface (surface of the mounting board 62) of the pod main body 56. At the clamping operation, the air chuck mechanism 108 moves upward by the lifting cylinder 107, and the first clamp arm 103b protrudes and approaches into the interior of the engaging concave portion 31. Further, the second clamp arm 104b is also on the surface of the mounting board 62, and is positioned at the lateral side of a connecting portion 34 to connect the clamped portion 33 and the pod main body 56 (see FIG. 6B). Subsequently, the air chuck mechanism 108 allows the top end portions of the first and second clamp arms 103b and 104b to approach to each other. By this operation, the clamp inclined portion 103c provided in the top end portion of the first clamp arm 103b and the clamped portion inclined surface 33a are approached and abutted against each other. Further, at the same time, the top end surface of the second clamp arm 104b and the outside surface of the connecting portion 34 are approached and abutted against each other. The approaching operation of both arms is stopped when the top end portions of both arms abut against their physical objects. This state is shown in FIG. 6C.

This stopping operation is preferably such that not only the engagement but also the drive are automatically stopped by using an air drive mechanism which is incapacitated to drive more than a predetermined load as the air chuck mechanism 108. In the present embodiment, the inclined surface of the clamp inclined portion 103c and the clamped inclined surface are abutted, and moreover, with a certain degree of load added to the abutting face, these inclined surfaces are fixed on the mounting board 62 of the pod 56. In this way, by allowing the inclined surfaces to abut against each other, a force (load)

given to the clamped portion 33 from the first clamp arm 103*b* is distributed into a force to press the clamped portion 33 to the mounting board 62 and a force to press the clamped portion 33 to the second clamp arm 104*b*. Further, the top end surface of the second clamp arm 104*b* and the side surface of the connecting portion 34 are abutted, so that the connecting portion 34 and the clamped portion 33 are nipped and fixed by the top end portions of the first and second clamp arms 103*b* and 104*b*.

The shapes of the first and second clamp members 103 and 104 as well as the corresponding clamped portion 33 and the like in the above described embodiment are not limited to those illustrated, nor limited to those if shaped and arranged in such a manner as to make a point contact accompanied with an appropriate load and yet not to cause a sliding and the like. Further, since it is easy to avoid an addition of an over load, the drive of each member shall be by an air operation system using a cylinder. However, the present invention is not limited to the air operation system, but an operation system comprising various fibrillation systems easy to make a control of loading capacity, a position control and the like may be used.

Figure 7:
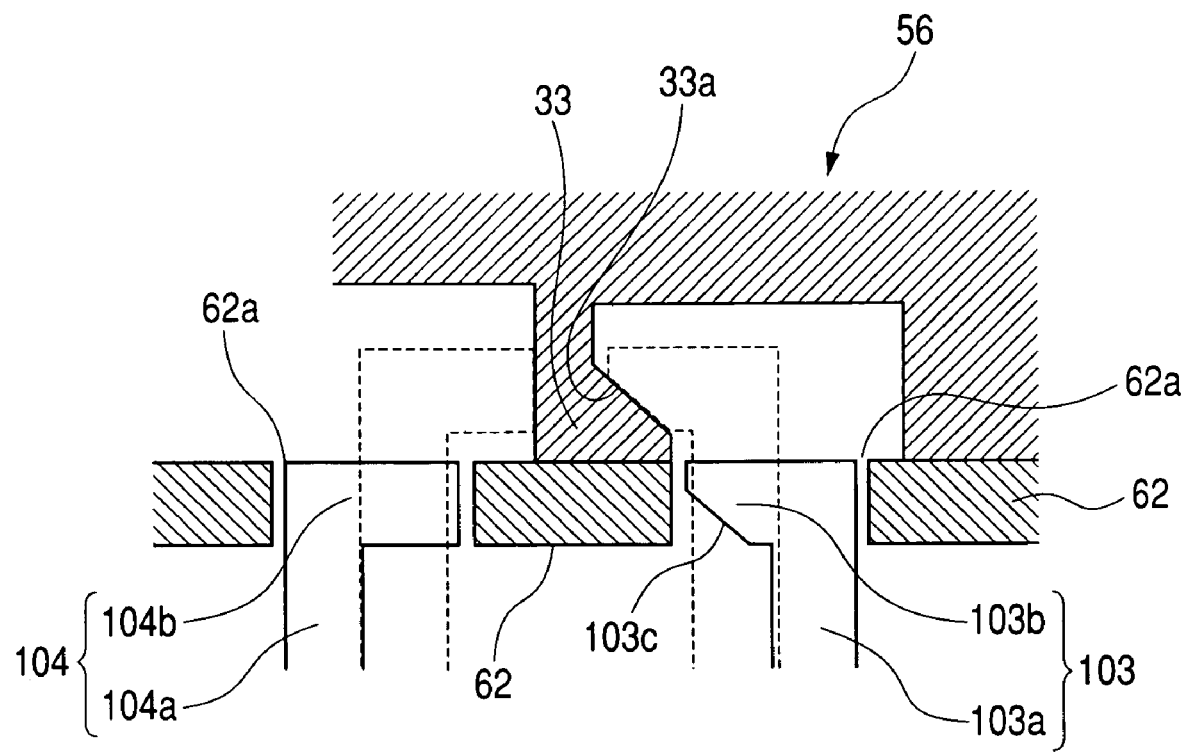
FIG. 7 is a view showing a modified example of a second embodiment according to the present invention.

A modified example in the embodiment of the present invention will be described below with reference to the drawings. The configuration showing the same operation as those of various configurations shown in FIG. 5 will be described by using the same reference numerals. FIG. 7 is a view showing a schematic side view of the clamping unit 101 and relative configurational elements in the present embodiment. The dotted lined portion shows a state of the clamp arms 103*b* and 104*b* gripping the clamped portion 33. In the present embodiment, penetration holes 62*a* passable by the clamp arms 103*b* and 104*b* are provided on the surface of the mounting board 62. Further, in the operation where these clamp arms 103*b* and 104*b* grip the clamped portion 33, the range in which the first and second support portions 103*a* and 104*a* are driven is fitted into the interior of the penetration holes 62*a*. As the present embodiment, there is no configuration on the surface of the mounting board 62 that is protruded except for an unillustrated positioning pin, and nothing that might hit upon the bottom face of the pod at the pod mounting operation time exist.

Figure 8:
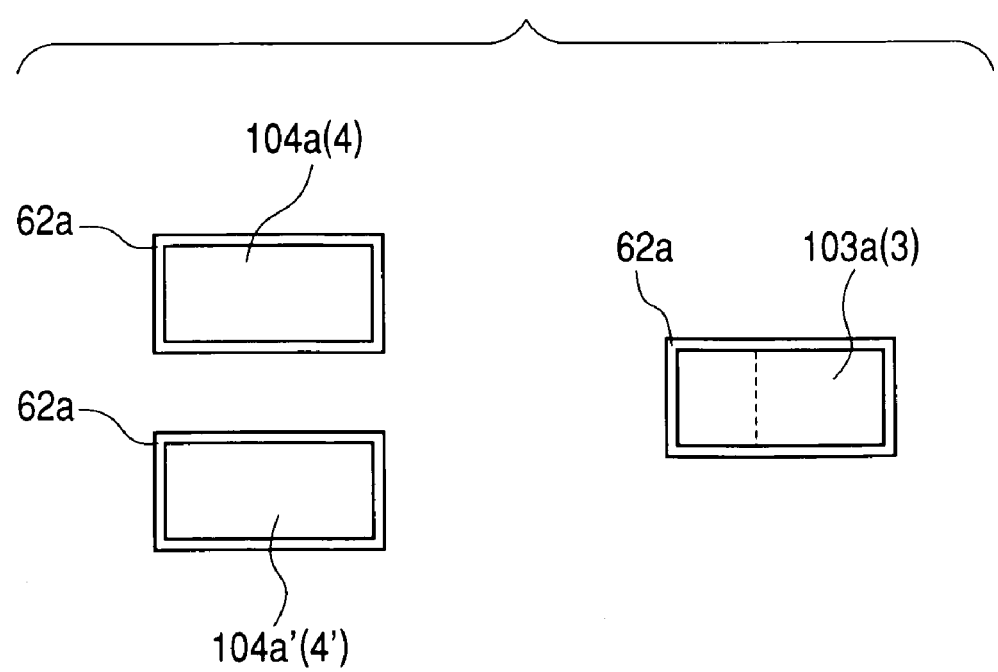
FIG. 8 is a view showing a modified example of the second embodiment according to the present invention.

In FIG. 8 is shown still another modified example. FIG. 8 shows a state of the clamp arm seen from the upper surface of the mounting board 62. As shown in the drawing, the second clamp member is provided in two pieces. Being composed of this configuration, even when a load is applied that might cause the displacement or the rotation of the pod in a direction orthogonal to a gripping direction of the clamp arm, it is possible to sharply reduce the likelihood of the pod moving from a clamped state. The number of clamp members or the driving direction thereof and the like are not limited to those embodiments as illustrated. The number of the clamp members may be further increased to obtain a gripping force required to fix the pod, and according to the shape of the clamped portion, the operational direction and the like of the clamp member drive mechanism, its operational direction, for example, may be set in a direction to which the top end of each clamp arm proceeds with a particular position as a center. In this case, irrespective of the moving direction of the clamp arm, the configuration is preferably such that the top end portion of the clamp arm abuts against the corresponding surface of the clamped portion.

The FIMS system actually comprising the clamping unit according to the present invention, the pod to be mounted on this system, the wafer transfer device attached to the FIMS system and the like will be described below as the embodiment of the present invention by using FIGS. 3 and 9. Since the various configurations shown in FIG. 3 have been already described, the description thereof will be omitted.

Figure 9:
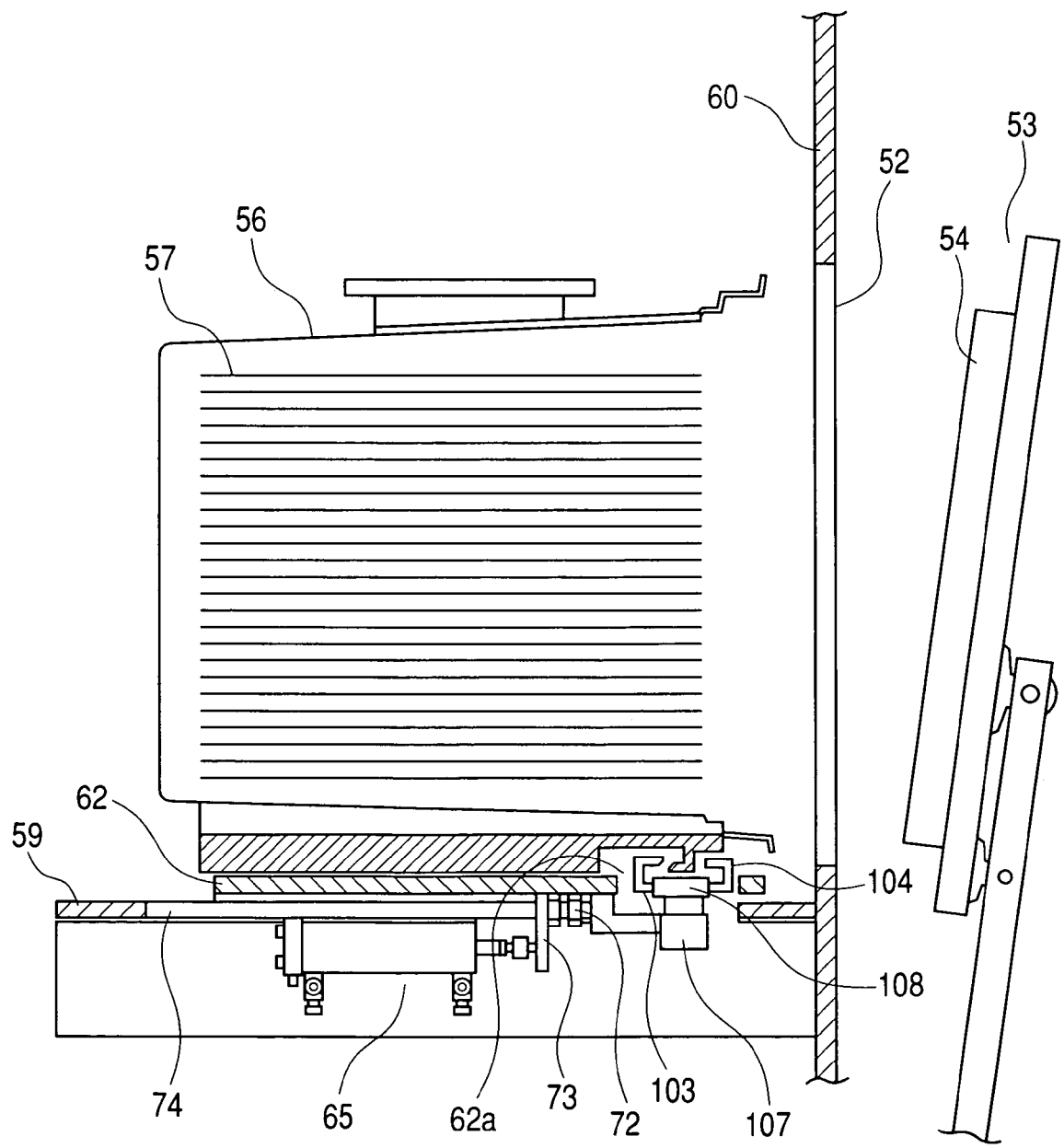
FIG. 9 is a side view including the partial section of the main elements in case of using the clamping unit according to the second embodiment of the present invention for the FIMS system shown in FIG. 3.

The mounting board 62, an opening 52 and a door 53 in the FIMS system 90 and a schematic sectional state of the configuration belonging to these elements are shown in FIG. 9. The mounting board 62 is arranged on a table 59 integrated with a wall 60 formed with the opening 52. The mounting board 62 is connected to an air cylinder 65 through a support member 73. The air cylinder 65 is fixed to the table 59 in the interior of a rectangular hole 74 provided in the table 59, and is used for allowing the mounting table 62 to approach to or to be spaced apart from the wall 60. The moving distance to the direction of the wall 60 of the mounting board 62 is defined by the abutment of an abutting member 72 against the end portion of the rectangular hole 74.

As described above, the lifting cylinder 107 is fixed to the under surface of the mounting board 62. Since the arrangement and relationship of each element configuring the air chuck mechanism 108 and other clamping units are not particularly different from the content described in the embodiment, the description thereof will be omitted here. By using the clamping unit comprising the configuration as described above, there will be no protruded member existing on the surface of the mounting board 62 except for the positioning pin. Consequently, it is possible to eliminate an unnecessary contact between the pod under surface and the mounting board surface and the wear and the like of the pod bottom portion accompanied with this contact. Further, with the mounting board surface made approximately flat, it is possible also to deal with an open cassette.

Third Embodiment

Figure 10:
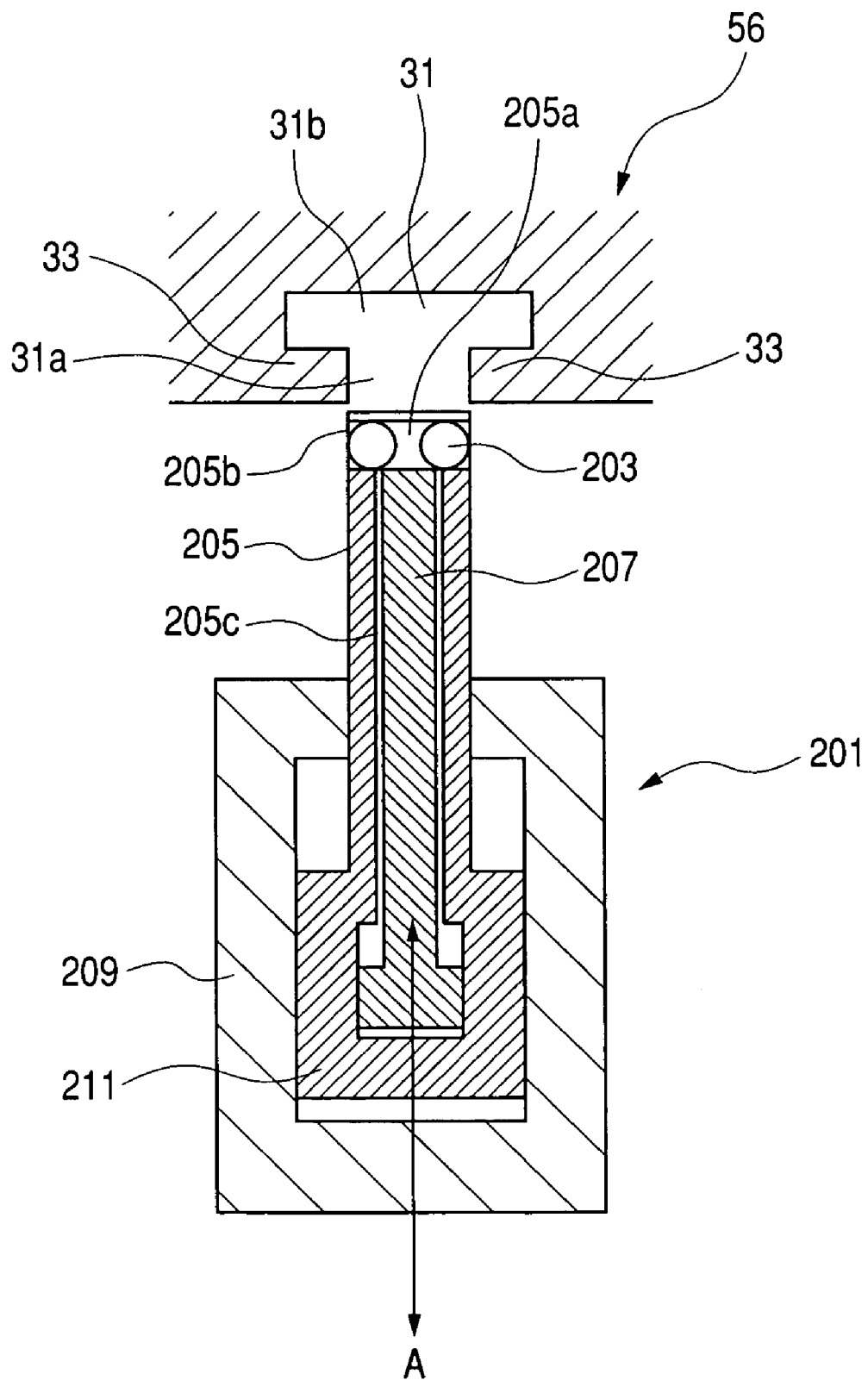
FIG. 10 relates to the clamping unit according to a third embodiment of the present invention, and is a side view showing its schematic configuration.

A third embodiment of the clamping mechanism according to the present invention will be described below with reference to the drawings. The same configuration as the configuration described in the first embodiment will be described by using the same reference numerals. FIG. 10 is a view showing a schematic configuration of the embodiment of a clamping mechanism according to the present invention. The clamping mechanism according to the present invention consists of an engaging concave portion 31 provided in the under surface of a pod main body 56 and a clamping unit 201 arranged in a FIMS system 90. The engaging concave portion 31 provided in the bottom face of a pod main body 56 comprises a engaging hole 31*b*, an opening 31*a* of the engaging hole, and a clamped portion 33 neighbored to the engaging hole 31*b* and protruded toward the center of the engaging concave portion 31 as if to cover a part of the engaging hole 31*b*.

In the present embodiment, the depth of the concave hole 31*b* is an inner depth capable of accommodating a clamp member opening and closing cylinder to be described later in a predetermined depth. That is, in the present embodiment, the engaging concave portion 31 comprises the engaging hole 31*b* formed from the bottom face of the pod 56 in the inner direction of the pod 56. The engaging concave portion 31 comprises an inner depth capable of accommodating the upper portion of a clamp member opening and closing cylinder 205 in a predetermined depth and an inner width capable of accommodating the clamp member opening and closing cylinder 205 in a protruded state of a clamp member 203. Further, in the opening portion of the engaging hole 31*b*, a clamped portion 33 protrudes toward the center of the engaging hole 31*b* as if to narrow the opening 31*a*, and allow the opening 31*a* to be approachable by the clamp member opening and closing cylinder 205 and, at the same time, defines the width of the opening 31*a* to be unapproachable by the clamp member opening and closing cylinder 205 in a protruded state of a clamp member 3. The pod main body 56 is supported by an unillustrated positioning pin and an approximate flat pod receiving surface on the mounting board 62.

A clamping unit 201 comprises a clamp member 203, the clamp member opening and closing cylinder 205, an opening and closing piston 207, a clamp member lifting cylinder 209, and a lifting piston 211. The clamp member 203 is supported in its upper end portion by the clamp member opening and closing cylinder 205 expandable and contactable in a vertical direction (an arrow mark direction shown by A in the drawing) by penetrating an opening 62a formed in the mounting board 62. The clamp member 203 is elastically held in the interior of a holding space 205a where a plurality of members are provided on the upper portion of the clamp member opening and closing cylinder 205. This elastic holding state may be such that, accompanied with the downward movement of an opening and closing piston 207 to be described later, the clamp member 203 is immediately restored to the interior of the inner space of the clamp member opening and closing cylinder 205, and this may be possible by the configuration where the restoration is made simply by the arrangement of a spring and the like or simply by its inertia.

Further, clamp member protruded openings 205b formed toward the outside of the cylinder are formed in the holding space 205a according to the number of clamp members 203. It is preferable that the clamp member protruded openings 205b are arranged in an approximate radial pattern with the cylinder axis as a center or in an opposed direction which is one form of the radial patterns in a flat surface orthogonal to up and down moving directions of the clamp member opening and closing cylinder 205. A cylindrical hole 205c is formed vertically at the lower part of the holding space 205a which is the interior of the clamp member opening and closing cylinder 205, and within that interior is arranged the opening and closing piston 207. The opening and closing piston 207 performs up and down movements vertically by introduction and discharge of the pressurized air from an unillustrated pressurized air source.

The clamp member 203 is in a state where the opening and closing piston 207 exists at the lower end thereof, and the whole thereof exists in the interior of the holding space 205a, and nothing is protruded from the outer peripheral surface of the clam member opening and closing cylinder 205. By the opening and closing piston 207 moving upward, the clamp member 203 is pushed out from the interior of the holding space 205a, and a part thereof is protruded from the outer peripheral surface of the clamp member opening and closing cylinder 205. By engaging this protruded portion with the clamped portion 33 provided in the under surface of the pod main body 56, the fixing operation of the pod main body 56 to the mounting board 62 is performed. By the downward movement of the opening and closing piston 207, the clamp member 203 is accommodated again in the inner space 205a by an elastic force. The clamp member opening and closing cylinder 205 is connected to the vertical upper end of the lifting piston 211 in the cylindrical hole of the interior of the clamp member lifting cylinder 209. The lifting piston 211 performs a vertical up and down movement by the introduction and discharge of a pressurized air from an unillustrated pressurized air source.

Being composed of these configurations, the protruding operation of the clamp member 203 from the clamp member opening and closing cylinder 205 can be performed independently from the up and down operation of the clamp member opening and closing cylinder. The clamp member 203, in its initial state, stands by at a position where there is no possibility of contacting the under surface of the pod main body 56 and, at a clamping operation time, is enabled to drive in a vertical direction and approach to the interior of the engaging concave portion 31. To be more specific, the clamp member opening and closing cylinder 205 can protrude on the surface of the mounting board 62 through a penetration hole 62a provided in the mounting board 62, and in its initial state, the top flat surface of the clamp member opening and closing cylinder 205 and the surface of the mounting board 62 are held so as to be approximately in the same flat surface. The vertical direction described here is a direction conveniently defined for the under surface of the pod, and it is preferable that the direction is appropriately set as a predetermined direction according to the shape and the like of the pod.

Figure 11:
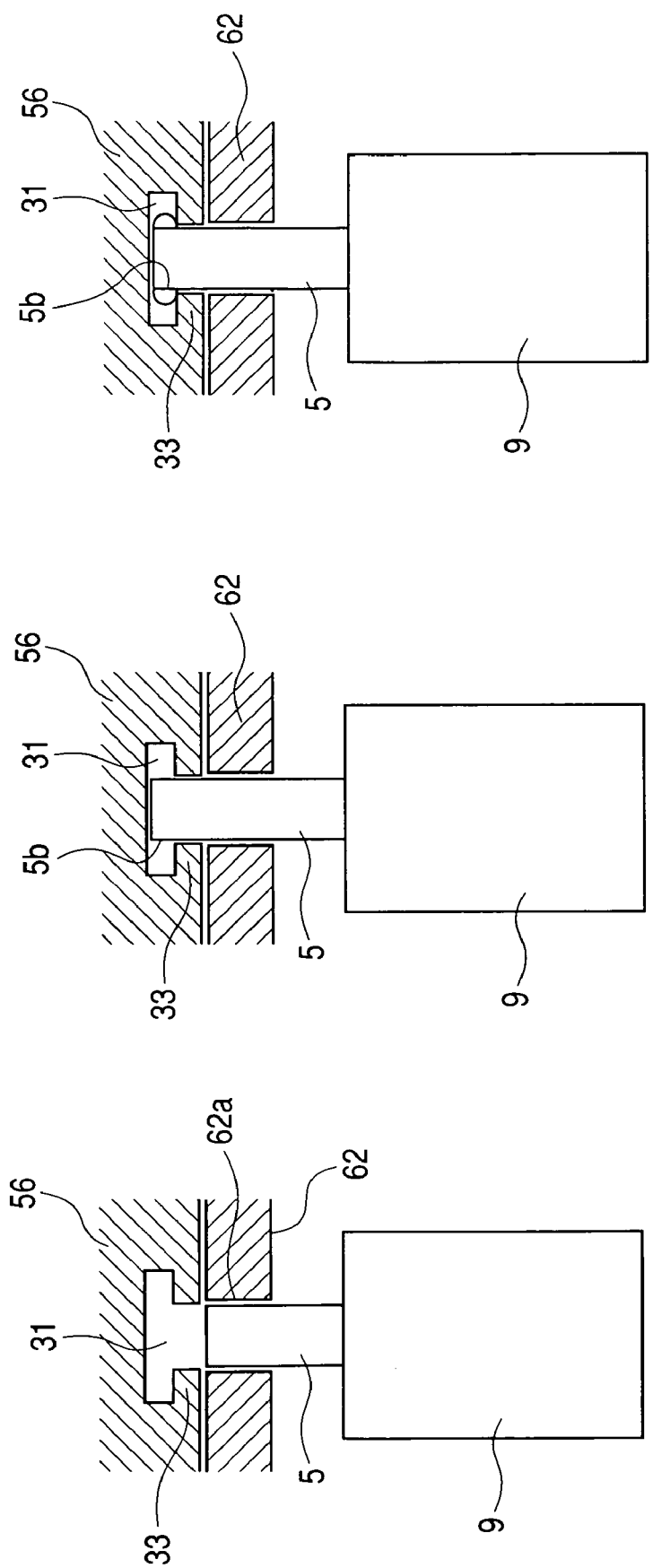
FIG. 11A is a view showing the operational state of the clamping unit shown in FIG. 10.
FIG. 11B is a view showing the operational state of the clamping unit shown in FIG. 10.
FIG. 11C is a view showing the operational state of the clamping unit shown in FIG. 10.

Next, an actual clamping operation by these clamping mechanisms will be described with reference to FIGS. 10 and 11A to 11C. The clamp member 203 in a state where the pod main body 56 is mounted on the mounting board 62 and its positioning is performed by an unillustrated positioning pin, as shown in FIG. 11A, is positioned at the lower part from the under surface of the pod main body 56. At this time, the opening and closing piston 207 is positioned at the lower part of its drive range, and the clamp member 203 is all accommodated in the interior of the inner space 205a. At the clamping operation time, the clamp member opening and closing cylinder 205 is driven vertically upward by the lifting cylinder 211, and a portion, in which a clamp member protruded hole 205b is formed, protrudes and approaches to the interior of the engaging concave portion 31 (see FIG. 11B).

Subsequently, the opening and closing piston 207 performs a vertical upward movement, and accompanied with this movement, as shown in FIG. 11C, a part of the clamp member 203 protrudes from the outer peripheral surface of the clamp member opening and closing cylinder 205. While maintaining this state, it performs a movement toward the vertical down direction of the lifting cylinder 211. By this operation, the protruded portion of the clamp member 203 firmly engages with the clamped portion 33, and the fixing operation of the pod main body 56 to the surface of the mounting board 62 is completed.

After the movement of the clamp member 203 and the like by the clamp member opening and closing cylinder 205 is completed, the clamp member opening and closing cylinder 205 205c is shrunk. This shrinking operation is stopped when the clamp portion 203a of the clamp member 203 and the engaging surface 33a of the clamped portion 33 are contacted and engaged. It is preferable that this stopping operation is such that, by using a cylinder incapable of driving more than a predetermined load as the vertical cylinder 207, not only the engagement but also the driving is automatically stopped. By giving this predetermined load by the vertical cylinder 207 between the clamp portion 203a and the engaging surface 33a, the pod main body 56 is fixed to the mounting board 62 accompanied with the predetermined load.

Figure 12:
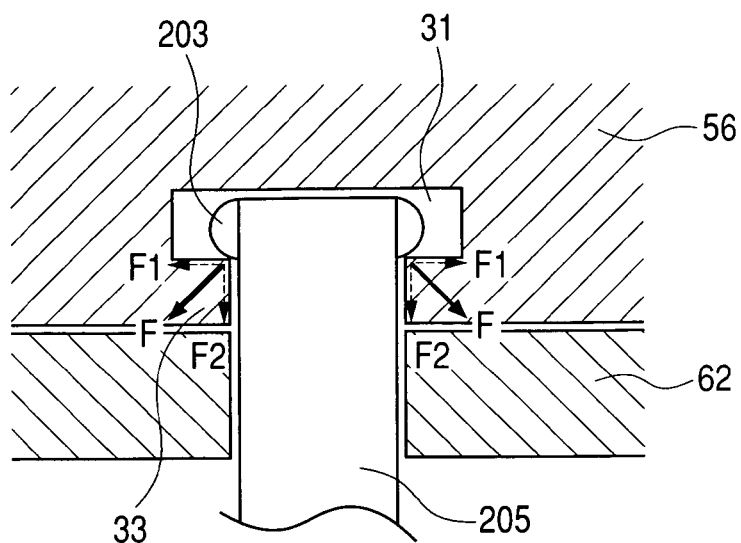
FIG. 12 is a view schematically showing a state of the load applied to a clamped portion in the clamping unit according to the present invention.

A load applied to the clamped portion 33 by the clamp member 203 is shown schematically in FIG. 12. FIG. 12 enlargedly shows the top end portion and the like of the clamp member lifting cylinder shown in FIG. 1C. The clamp member 203 having a ball-shape with a part thereof in a state of protruding from the clamp member opening and closing cylinder 205 is pulled downward (in an opening direction of the engaging concave portion 31). By this operation, one point of the outer surface of the clamp member 203 is brought into contact with an inner peripheral surface angle portion of the engaging concave portion side of the clamped portion 33, and gives a pressure load shown by an arrow mark F in the drawing to the contact point. This pressure load is divided into a force F1 operating in a direction which is parallel to the bottom face of the pod 56 and in which each clamp member is opposed to each other, and into a force F2 which presses the pod 56 to the surface of the amounting board 62. According to the conventional pod clamping mechanism, the fixing of the pod is usually performed only by the force F2. However, in the present invention, by still further effect of the force F1, the pod 56 is firmly fixed in a direction parallel to the bottom face of the pod, that is, in a direction to the horizontal movement of the pod 56.

Figure 13:
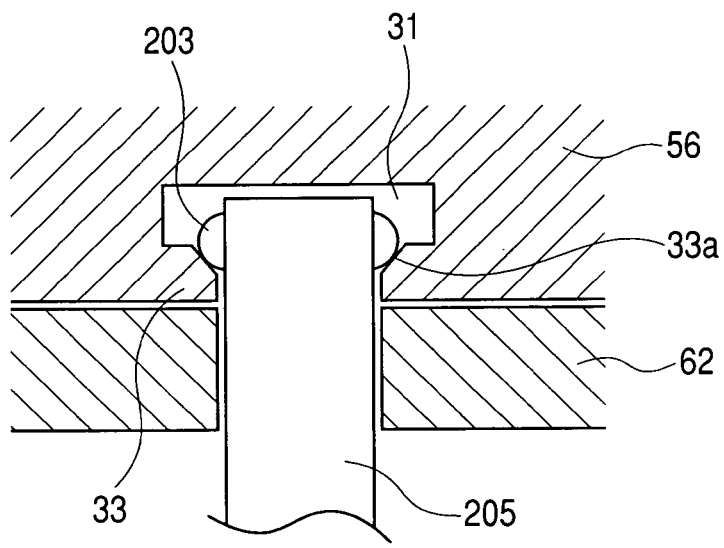
FIG. 13 is a view showing the modified example of the clamping unit according to the present invention.

Next, with respect to the embodiment of the present invention, its modified example will be described below. In FIG. 13, a modified example of the embodiment is shown in the same style as FIG. 12. In this modified example, a clamped inclined surface 33a is provided in an angle portion of the inner peripheral surface of the engaging concave portion 31 side in the clamped member 33 as if to narrow the width of the opening as proceeding toward the opening. The contact with the clamp member 203 is not made by the angle portion like the above described embodiment, but by the surface, so that much stable engaging state can be obtained. Further, by adjusting an inclined angle for up and down directions of this surface, it is possible to adjust a balance between the F1 and F2. Further, by allowing this surface-shape to correspond to the contact portion in the clamp member 203, much stable engaging state can be obtained.

Figure 14:
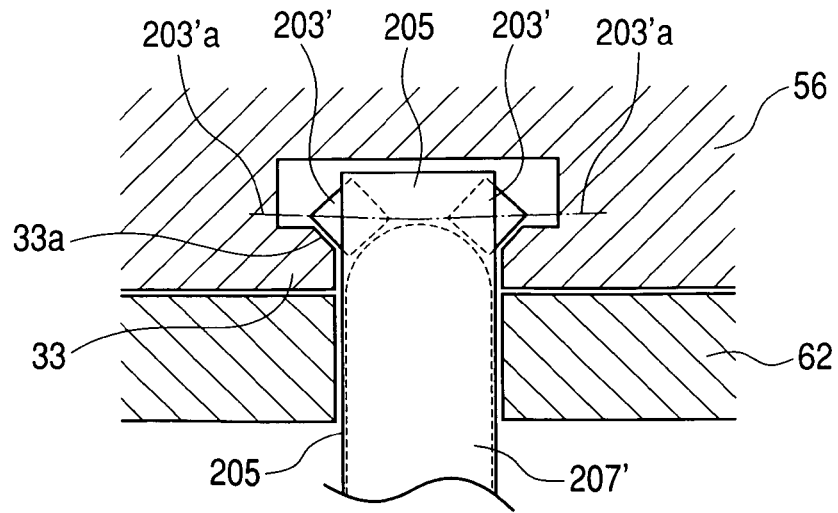
FIG. 14 is a view showing the modified example of the clamping unit according to the present invention.

In FIG. 14 is shown a still further modified example of the embodiment in the same style as FIG. 12. In the present embodiment, a clamp members 203' is formed by coaxially connecting the bottom faces of two circular cones having an axis 203'a mutually. Further, the upper end portion of a lifting cylinder 207' is formed in the shape of a ball so that the clamp member 2031 is easily protruded from the inner space of the clamp member opening and closing cylinder. Further, the clamped portion 33, similarly to the above described modified example, is provided with the clamped inclined surface 33a. By these configurations, the contact state between the clamp member and the clamped portion can be changed from a point contact to a line contact, thereby obtaining much stable engaging state.

The shapes of the clamp member 203, the clamped portion 33, the top portion of the opening and closing piston 207 and the like in the above described embodiment are not limited to the spherical shape, the rectangular shape, the flat shape as illustrated, respectively, but nor limited to those if shaped and arranged in such a manner as to make a point contact accompanied with an appropriate load and yet not to cause a sliding and the like. Further, since it is easy to avoid an addition of an over load, the drive of each member by an air operation system using a cylinder. However, the present invention is not limited to the air operation system, but an operation system comprising various fibrillation systems easy to make a control of loading capacity, a position control and the like may be used.

A FIMS system actually comprising the clamping mechanism according to the present invention, the pod to be mounted on this system, and a wafer transfer device attached with the FIMS system and the like will be described below as the embodiment of the present invention by using the FIGS. 3 and 15. Since the various configurations shown in FIG. 3 have already been described, the description thereof will be omitted here.

Figure 15:
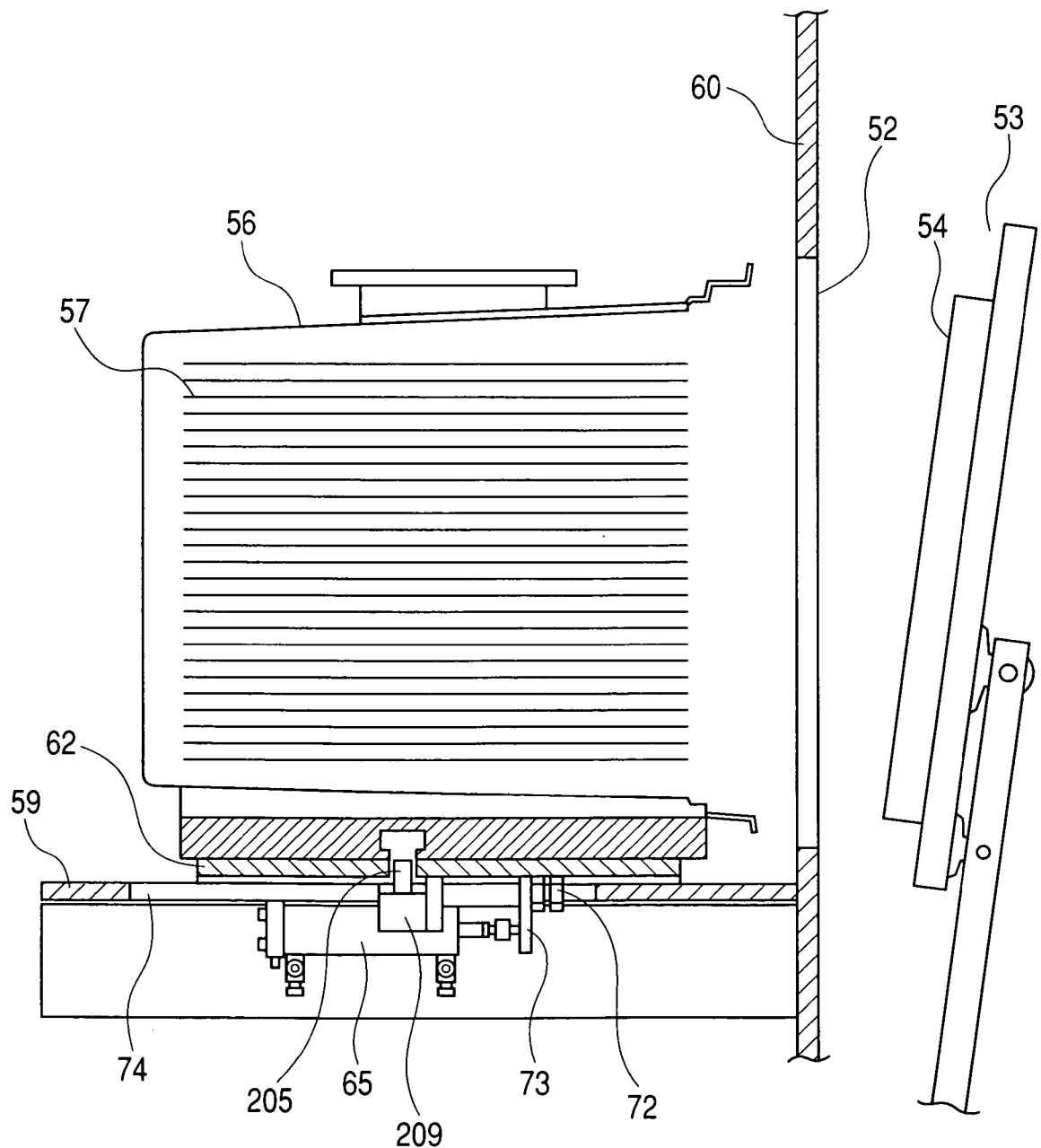
FIG. 15 is a side view including the partial section of the main elements in case of using a clamping unit according to a third embodiment of the present invention for the FIMS system shown in FIG. 3.

Approximate sectional states of the mounting board 62, an opening 52, and a door 53 in the FIMS system 90 as well as the configuration accompanied with these elements are shown in FIG. 15. The mounting board 62 is arranged on a table 59 integrated with a wall 60 formed with the opening 52.

The mounting board 62 is connected to an air cylinder 65 through a support member 73. The air cylinder 65 is fixed to the table 59 in the interior of a rectangular hole 74 provided in the table 59, and is used for allowing the mounting table 62 to approach to or to be spaced apart from the wall 60. The moving distance in a direction of the wall 60 of the mounting board 62 is defined by the abutment of an abutting member 72 against the end portion of the rectangular hole 74.

As described above, a clamp member lifting cylinder 209 is fixed to the under surface of the mounting board 62. Since the arrangement and relationship of each element configuring the clamp member lifting cylinder 209 and other clamping mechanisms are not particularly different from the content described in the embodiment, the description thereof will be omitted here. By using the clamping mechanisms comprising the configuration as described above, there will be no protruded member existing on the surface of the mounting board 62 except for a positioning pin. Consequently, it is possible to eliminate an unnecessary contact between the pod under surface and the mounting board surface and the wear and the like of the pod bottom portion accompanied with this contact. Further, with the mounting board surface made approximately flat, it is possible also to deal with an open cassette.

Fourth Embodiment

Figure 16:
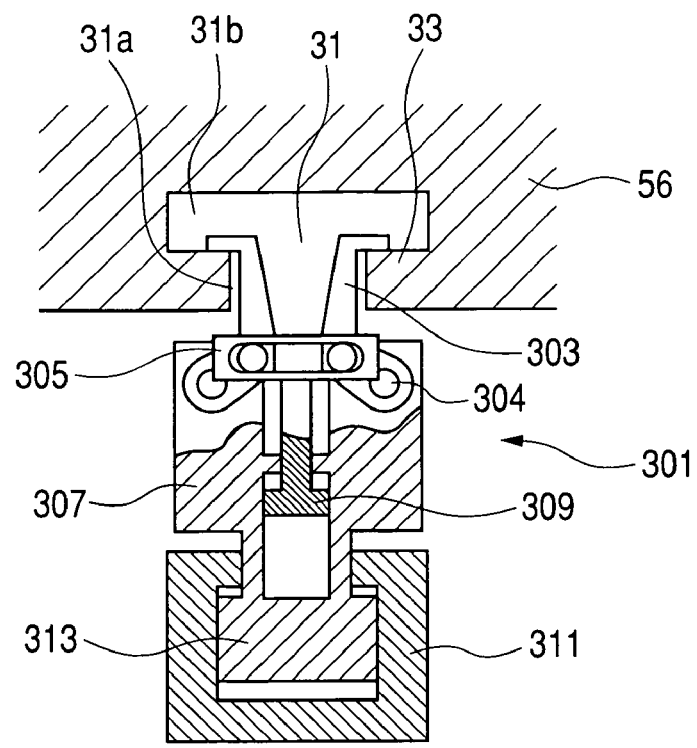
FIG. 16 relates to the clamping unit according to a fourth embodiment of the present invention, and is a side view showing its schematic configuration.

A fourth embodiment of a clamping mechanism according to the present invention will be described below with reference to the drawings. The same configuration as the configuration described in the first embodiment will be described by using the same reference numerals. FIG. 16 is a view showing a schematic configuration of the embodiment of a clamping mechanism. The clamping mechanism according to the present invention consists of an engaging concave portion 31 provided in the under surface of a pod main boy 56, and a clamping unit 301 arranged in a FIMS system 90. The engaging concave portion 31 provided in the bottom face of the pod main body 56 comprises an engaging hole 31b, an opening 31a of the engaging hole, and a clamped portion 33 neighbored to the engaging hole 31b and protruded toward the center of the opening 31a as if to cover a part of the engaging hole 31b.

In the present embodiment, the depth of the engaging hole 31b is an inner depth capable of accommodating a clamp member to be described later in a predetermined depth. That is, in the present embodiment, the engaging concave portion 31 comprises the engaging hole 31b formed in a direction of the pod 56 from the bottom face of the pod 56. This engaging hole 31b has an inner depth capable of accommodating a clamp member 303 in an engaging posture in a predetermined depth and an inner width capable of performing up and down movements within a predetermined range of a clamp member 3.

Further, in the opening portion of the engaging hole 31b, a clamped portion 33 protrudes toward the center of the engaging hole 31b as if to narrow the opening 31a, and is formed in such a manner as to be able to engage with a clamp portion 303a of the clamp member 303 when the clamp member 303 in an engaged state moves downward. The size of the opening 31a is defined by the clamped portion 33. The surface of the engaging hole 31b side of the clamped portion, particularly the peripheral portion of the opening 31a in the surface operates as a substantial clamped surface. The pod main body 56 is supported by an unillustrated positioning pin on the mounting board 62 and an approximate flat pod receiving surface.

Figure 17:
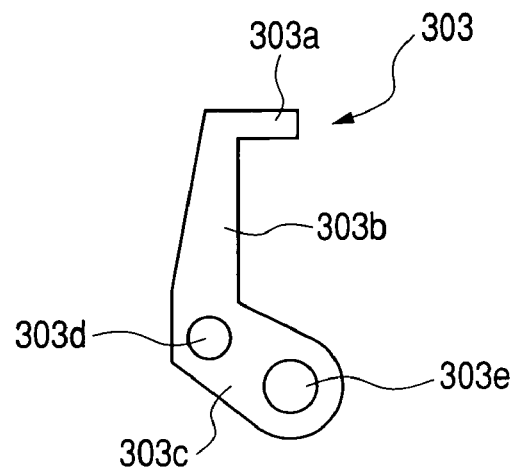
FIG. 17 is a view showing a configuration of a clamp member 3 in the clamping unit shown in FIG. 16.
Figure 18:
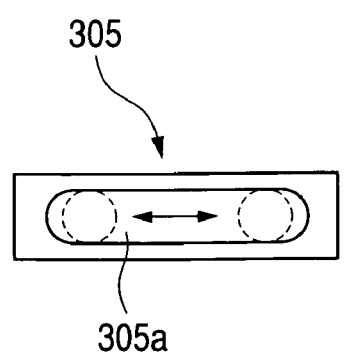
FIG. 18 is a view showing a configuration of a link 5 in the clamping unit shown in FIG. 16.

The clamping unit 301 comprises a pair of clamp members 303, a link 305, a clamp member opening and closing cylinder 307, an opening and closing piston 309, a clamp member lifting cylinder 311, and a lifting piston 313. In FIG. 17 is shown a schematic illustration of the clamp member 303. The clamp member 303 consists of a straight-line portion 303b, a bent portion 303c connected to one end of the straight-line portion 303b and bent and expanded in a predetermined direction for a straight-line portion 303b; and a clamp portion 303a connected to the other end of the straight-line portion 303b and expanded in the same direction as the bent portion 303c. The surface approximately opposing to the bent portion 303c in the clamp portion 303a operates as a substantial clamp surface. The connecting portion between the straight-line portion 303b and the bent portion 303c is embedded with a slide pin 303d, which is expanded in a direction orthogonal to these expanded surfaces. Further, an axis of rotation 304 to be described later penetrates into the end portion of the bent portion 303c so as to form a penetration hole 303e for rotatably supporting the clamp member 303. Further, as its outline is shown in FIG. 18, a link 305 comprises a planar member extending in one direction, and in a planer center portion of the member, there is formed a long hole 305a extending in its expanding direction.

The clamp member 303 is rotatably supported by the axis of rotation 304 for the clamp member opening and closing cylinder 307 with the axis of rotation 304 as a center. Further, a slide pin 303d is slidably inserted into a long hole 305a in the link 305 in its longitudinal direction. Further, the link 305 is connected to the upper end portion of the opening and closing piston 309 accommodated in the interior of the clamp member opening and closing cylinder 307. Accompanied with the lifting operation of the opening and closing piston 309, the link 305 is also moved upward. The clamp member 303 is rotated according to the movement of the link 305 by the intermediary of the slid pin 303d, and the straight line portion 303b and the clamp portion 303a also move upward. The upper end portion of the moving range of the opening and closing piston 309 corresponds to the rotational amount of the clamp member 303 in which the substantial clamp surface of the clamp 303a and the substantial clamped surface of the clamped portion 33 are in parallel. Further, the lower end portion of the moving range of the opening and closing piston 309 is set such that the clamp member 303 is positioned at the lower part from the surface of the mounting board 62 in the initial state where the pod 56 is mounted on the mounting board 62.

The up and down operations of the opening and closing piston 309 are performed by the introducing and discharging operations of an air pressurized in the interior of the clamp member opening and closing cylinder 307. The clamp member opening and closing cylinder 307 is supported in the upper end portion of the lifting piston 313. The lifting piston 313 is supported by the camp member lifting cylinder 311, and by performing the introduction and discharge of the air pressurized in the interior of the cylinder, the up and down operations of the lifting piston 313, the clamp member opening and closing cylinder 307, and the clamp member 303 are performed.

The clamp member lifting cylinder 313 is fixed to the mounting board 62. On the surface of the mounting board 62, there is formed an opening 62a, which is penetrated from the rear surface thereof, and the clamp member opening and closing cylinder 307 is engaged with this opening 62a. The drive range of the clamp member opening and closing cylinder 307, that is, the upper end position in the range of the up and down movement of the lifting piston 313 is set such that the upper end surface of the clamp member opening and closing cylinder 307 is placed at the lower part from the surface of the mounting board 62. Further, the lower end position is set in such a manner as to be slightly downward from a position corresponding to the position where the clamp portion 303a and the clamped portion 33 are engaged by allowing the clamp member opening and closing cylinder 307 to move downward in a state where the clamp member 303 is in a clamping posture.

Being composed of these configurations, the clamp member 303, in its initial state, stands by at a position where there is no possibility of contacting between the clamp member and the under surface of the pod main body 56 and, at the clamping operation time, is enabled to approach into the interior of the engaging concave portion 31 in the pod. The up and down directions described here are conveniently defined directions for the surface of the mounting board 62, and it is preferable that the directions are appropriately set as a first direction according to the shape and the like of the pod.

Figure 19A:
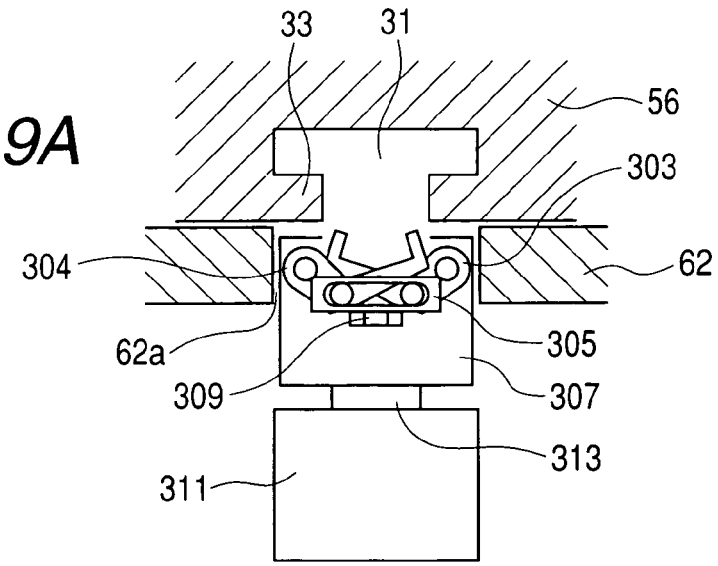
FIG. 19A is a view showing the operational state of the clamping unit shown in FIG. 16.

Next, an actual clamping operation by these clamping mechanisms will be described with reference to FIGS. 16 and 19A to 19C. The arrangement of the clamp member 303 in a state where the pod main body 56 is mounted on the mounting board 62 and its positioning is performed by an unillustrated positioning pin and the like is, as shown in FIG. 19A, positioned at the lower part from the under surface of the pod main body 56. At this time, the opening and closing cylinder 309 stops at the lower end position, and the lifting cylinder 313 stops at the upper end position. At the clamping operation time, first, the link 305 is pushed upward by the opening and closing piston 309, and accompanied with this operation, the clamp member 303 rotates with the axis of rotation 304 as a center.

Figure 19B:
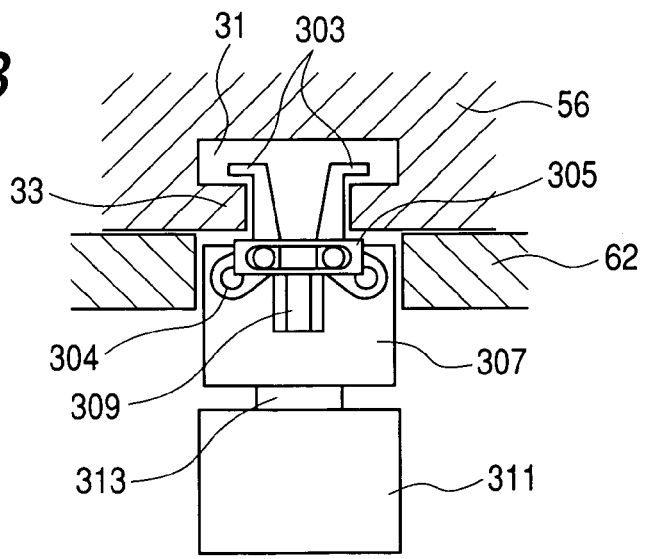
FIG. 19B is a view showing the operational state of the clamping unit shown in FIG. 16.
Figure 19C:
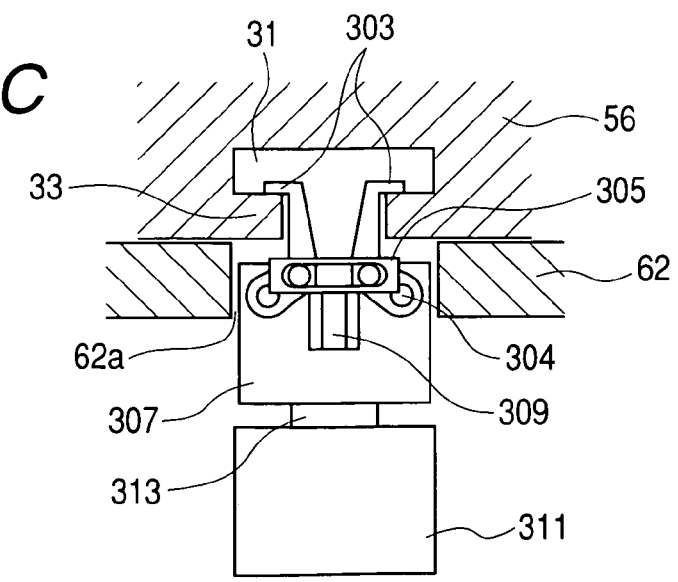
FIG. 19C is a view showing the operational state of the clamping unit shown in FIG. 16.

As shown in FIG. 19B, by the attainment of the opening and closing piston 309 to the upper end position, the substantial engaging surface in the clamp member 303 and the substantial engaged surface of the clamped portion 33 of the pod side are put into an approximate parallel positional relationship. By this operation, the clamp member 303 is expanded upward, and the clamp member 303 protrudes and approaches into the interior of the engaging concave portion 31. Subsequently, the lifting piston 313 supported in the clamp member lifting cylinder 311 is shrunk, and the clamp member 303 is moved downward together with the clamp member lifting cylinder 307 and the like. From a state where the clamp member 303 and the clamped portion 33 are engaged, the downward moving operation of the lifting piston 313 is further performed, and after that, the operation is stopped. This state is shown in FIG. 19C.

It is preferable that this stopping operation is such that, by using a cylinder incapable of driving more than a predetermined load as the clamp member lifting cylinder 311, not only the engagement but also the driving is automatically stopped. By giving this predetermined load by the clamp member lifting cylinder 311 between the clamp portion 303a and the clamped portion 33, the pod main body 56 is fixed to the mounting board 62 accompanied with the predetermined load.

The shapes of the clamp member 303 and the clamped portion 33 in the above described embodiment are not limited to those illustrated, nor limited to those provided if shaped and arranged in such a manner as to make a point contact accompanied with an appropriate load and yet not to cause a sliding and the like. Further, since it is easy to avoid an addition of an over load, the drive of each member shall be by an air operation system using a cylinder. However, the present invention is not limited to the air operation system, but an operation system comprising various fibrillation systems easy to make a control of loading capacity, a position control and the like may be used.

The FIMS system actually comprising the clamping unit according to the present invention, the pod to be mounted on this system, the wafer transfer device attached to the FIMS system and the like will be described below as the embodiment of the present invention by using FIGS. 3 and 20. Since the various configurations shown in FIG. 3 have been already described, the description thereof will be omitted.

The mounting board 62, the opening 52 and the door 53 in the FIMS system 90 and a schematic sectional state of the configuration belonging to these elements are shown in FIG. 20. The mounting board 62 is arranged on a table 59 integrated with a wall 60 formed with the opening 52. The mounting board 62 is connected to an air cylinder 65 through a support member 73. The air cylinder 65 is fixed to the table 59 in the interior of a rectangular hole 74 provided in the table 59, and is used for allowing the mounting table 62 to approach to or to be spaced apart from the wall 60. The moving distance to the direction of the wall 60 of the mounting board 62 is defined by the abutment of an abutting member 72 against the end portion of the rectangular hole 74.

As described above, the clamp member lifting cylinder 311 is fixed to the under surface of the mounting board 62. Since the arrangement and relationship of each element configuring the clamp member lifting cylinder 311 and other clamping mechanisms are not particularly different from the content described in the embodiment, the description thereof will be omitted here. By using the clamping mechanisms comprising the configuration as described above, there will be no protruded member existing on the surface of the mounting board 62 except for the positioning pin. Consequently, it is possible to eliminate an unnecessary contact between the pod under surface and the mounting board surface and the wear and the like of the pod bottom portion accompanied with this contact. Further, with the mounting board surface made approximately flat, it is possible also to deal with an open cassette.

Fifth Embodiment

Figure 21:
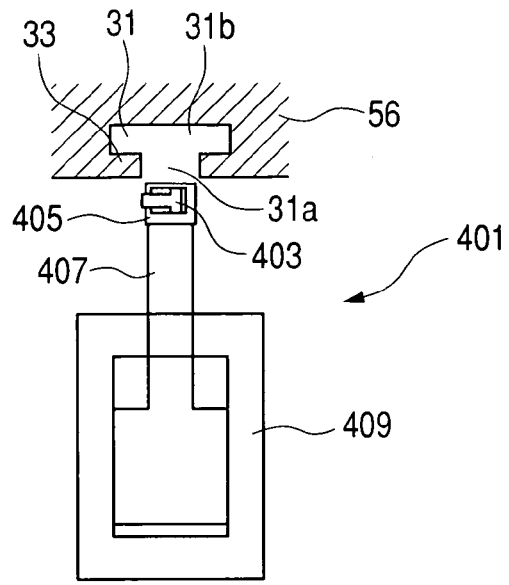
FIG. 21 relates to a clamping mechanism according to a fifth embodiment of the present invention, and is a side view showing its schematic configuration.

A fifth embodiment of the clamping mechanism according to the present invention will be described below with reference to the drawings. The same configuration as the configuration described in the first embodiment will be described by using the same reference numerals. FIG. 21 is a view showing a schematic configuration of the embodiment of the clamping mechanism according to the present invention. The clamping mechanism according to the present invention consists of an engaging concave portion 31 provided in the under surface of a pod main body 56 and a clamping unit 401 arranged in a FIMS system 90. The engaging concave portion 31 provided in the bottom face of the pod main body 56 comprises a engaging hole 31b, an opening 31a of the engaging hole, and a clamped portion 33 neighbored to the engaging hole 31b and protruded toward the center of the engaging concave portion 31 as if to cover a part of the engaging hole 31b.

In the present embodiment, the depth of the engaging hole 31b is an inner depth capable of accommodating a clamp member to be described later in a predetermined depth. That is, in the present embodiment, the engaging concave portion 31 comprises the engaging hole 31b formed from the bottom face of the pod 56 in a direction of the pod 56. This engaging hole 31b has an inner depth capable of accommodating a clamp member 3 in an engaging posture in a predetermined depth and an inner width capable of performing up and down movements within a predetermined range of a clamp member 403.

Further, in the opening portion of the engaging hole 31b, a clamped portion 33 protrudes toward the center of the engaging hole 31b as if to narrow the opening 31a, and is formed in such a manner as to be able to engage with a clamp portion 403a of the clamp member 403 when the clamp member 403 in an engaged state moves downward. The size of the opening 31a is defined by the clamped portion 33. The surface of the engaging hole 31b side of the clamped portion, particularly the peripheral portion of the opening 31a in the surface operates as a substantial clamped surface. The pod main body 56 is supported by an unillustrated positioning pin on the mounting board 62 and an approximate flat pod receiving surface.

The clamping unit 401 comprises an approximate bar-shaped clamp pin piston 403 which is an clamp member, a clamp pin cylinder 405, an approximate bar-shaped lifting piston 407, and a lifting piston cylinder 409. The clamp member 403 has its one end portion accommodated in the interior of the clamp pin cylinder 405. By performing the introduction and discharge operations of an air pressurized by an unillustrated gas introduction system, operations of expansion and contraction of the clamp member 403 from the cylinder 405 are performed. The directions of the expansion and contraction and the like of the clamp member are set in directions approximately parallel to the surface of the mounting board 62.

The clamp pin cylinder 405 penetrates the opening 62a formed in the mounting board 62 (see FIG. 22A) and is fixed to the upper end portion of the lifting piston 407 expandable and contactable up and down for the mounting board surface. Further, the lifting piston 407 has the other end thereof accommodated in the interior of the lifting piston cylinder 409. By performing the introduction and discharge operations of an air pressurized by an unillustrated gas introduction system, operations of expansion and contraction of the lifting piston 407 are performed. The clamp pin cylinder 405, in its initial state, holds the clamp member 403 and stands by at a position where the under surface of the pod main body 56 and the clamp member 403 are not in contact when the pod main body 56 is mounted on the mounting board 62. The major part of the lifting piston 407 and the lifting piston cylinder 409 are arranged within the lower space of the mounting board 62. Further, the lifting piston cylinder 409 is fixed to the mounting board 62.

Being composed of these configurations, the clamp member 403, in its initial state, stands by at a position not possible to contact the under surface of the pod main body 62, and is enabled to drive independently up and down and in a direction orthogonal to up and down directions. The up and down directions described here are conveniently defined for the upper and lower surfaces of the pod, and it is desirable that the directions be set conveniently as a first direction, respectively according to the shape and the like of the pod.

Figure 22A:
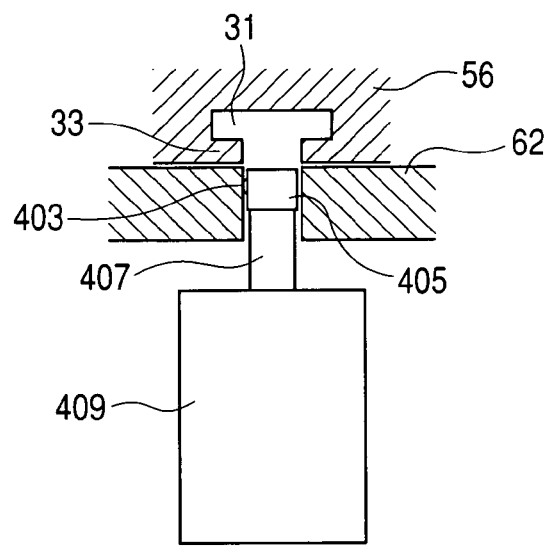
FIG. 22A relates to the clamping mechanism shown in FIG. 21, and is a view showing its operational state.
Figure 22B:
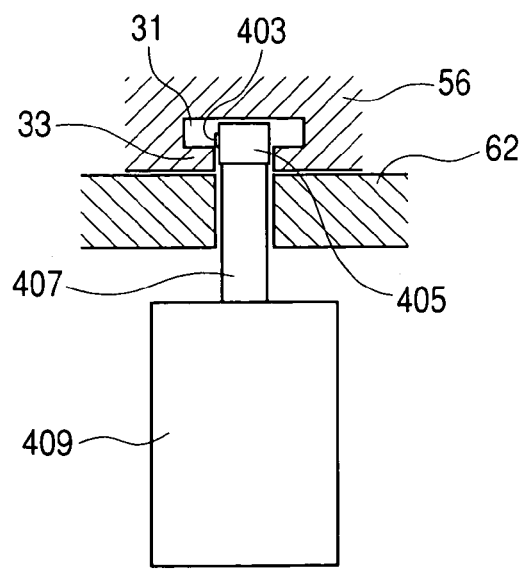
FIG. 22B relates to the clamping mechanism shown in FIG. 21, and is a view showing its operational state.

Next, an actual clamping operation by these clamping mechanisms will be described with reference to FIGS. 21 and 22A to 22E. The arrangement of the clamp member 403 in a state where the pod main body 56 is mounted on the mounting board 62 and its positioning is performed by an unillustrated positioning pin, as shown in FIG. 22A, is positioned at the under surface of the pod 56, that is, at the lower part from the surface of the mounting board 62. At the clamping operation time, for example, the pressurized air is introduced to the lifting piston cylinder 409 by an unillustrated pressurized air source, so that the lifting piston 407 is expanded, and the clamp pin cylinder 405 protrudes and approaches into the interior of the engaging concave portion 31 (FIG. 22B).

Figure 22C:
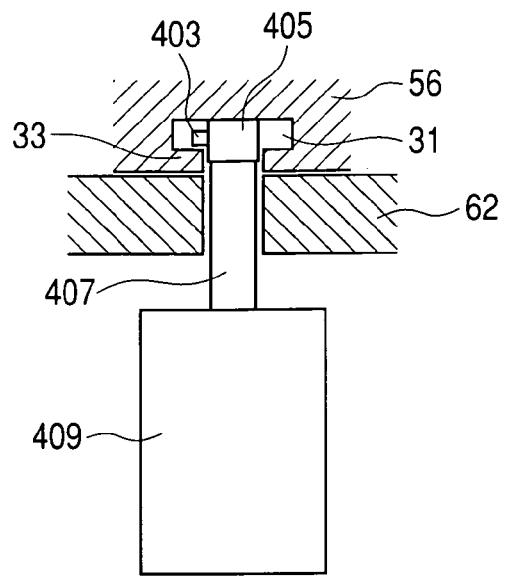
FIG. 22C relates to the clamping mechanism shown in FIG. 21, and is a view showing its operational state.
Figure 22D:
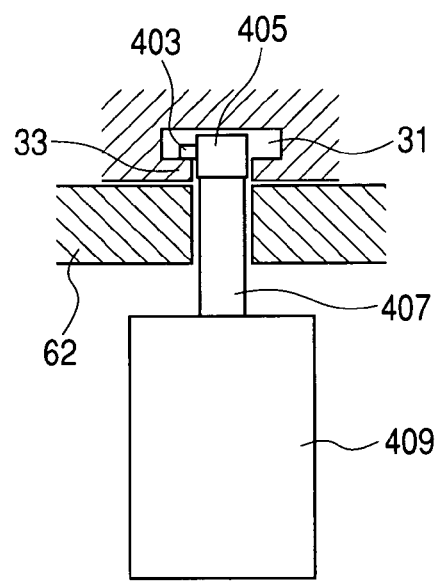
FIG. 22D relates to the clamping mechanism shown in FIG. 21, and is a view showing its operational state.
Figure 22E:
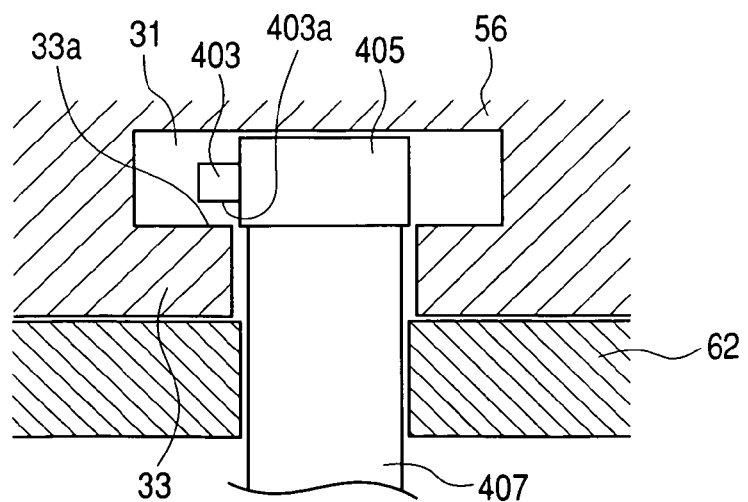
FIG. 22E relates to the clamping mechanism shown in FIG. 21, and is a view enlargedly showing a clamp member and its member and the member relating to the clamping operation time.

The lifting amount of the lifting piston 407 is set in advance according to the inner depth of the engaging concave portion 31. Subsequently, for example, the pressurized air is introduced into the clamp pin cylinder 405 from an unillustrated pressurized air source, so that the clamp member 403 expands and protrudes to a position where a part of the clamp member 403 is engaged with the clamped portion 33 (FIG. 22C). The protruding amount of the clamp member 403 is set in advance according to the protruding amount of the clamp member toward the opening 31a in the clamped portion 33. When the clamp member 403 reaches a predetermined horizontal position where the clamp member 403 can engage with the clamped portion 33, this movement is stopped.

After the protruding operation of the clamp member 403 by the clamp pin cylinder 405 is completed, the lifting piston 407 is shrunk. This shrinking operation is stopped when the clamp portion 403a of the clamp member 403 and the engaging surface 33a of the clamped portion 33 are contacted and engaged (see FIGS. 22D and 22E). It is preferable that this stopping operation is such that, by using a cylinder incapable of driving more than a predetermined load as the lifting piston cylinder 409, not only the engagement but also the driving is automatically stopped. By giving this predetermined load by the lifting piston cylinder 409 between the clamp portion 403a and the engaging surface 33a, the pod main body 56 is fixed to the mounting board 62 accompanied with the predetermined load.

The shapes of the clamp member 403 and the clamped portion 33 in the above described embodiment are not limited to those illustrated, nor limited to those if shaped and arranged in such a manner as to make a point contact accompanied with an appropriate load and yet not to cause a sliding and the like. Further, since it is easy to avoid an addition of an over load, the drive of each member shall be by an air operation system using a cylinder. However, the present invention is not limited to the air operation system, but an operation system comprising various fibrillation systems easy to make a control of loading capacity, a position control and the like may be used.

Further, a combination comprising the clamp pin cylinder 405 and the clamp member 403 is not limited to one set, but in the case of the shape like the engaging concave portion 31 of the under surface of the pod 56 as shown in the drawing, two sets may be used. Further, though the clamp portion 403a and the engaging surface 33a are both taken as surfaces approximately in parallel to the under surface of the pod 56, the present invention is not limited to these surfaces. For example, the clamp portion 403a and the engaging surface 33a comprising two sets, respectively may be configured to comprise surfaces both inclined at a predetermined negative or positive angle for the under surface of the pods. By configuring the clamp portion and the engaging surface from these surfaces, a force not only to press the pod on the mounting board surface, but also to fix the pod to a predetermined position can be granted. Consequently, more stably fixed state of the pod can be obtained.

Embodiment 1

A FIMS system actually having a clamping mechanism according to the present invention, a pod to be mounted on this system, a wafer transfer device attached with the FIMS system, and the like will be described below by using FIGS. 3 and 23 as an embodiment of the present invention. Since the various configurations shown in FIG. 3 have already been described, the description thereof will be omitted here.

Figure 23:
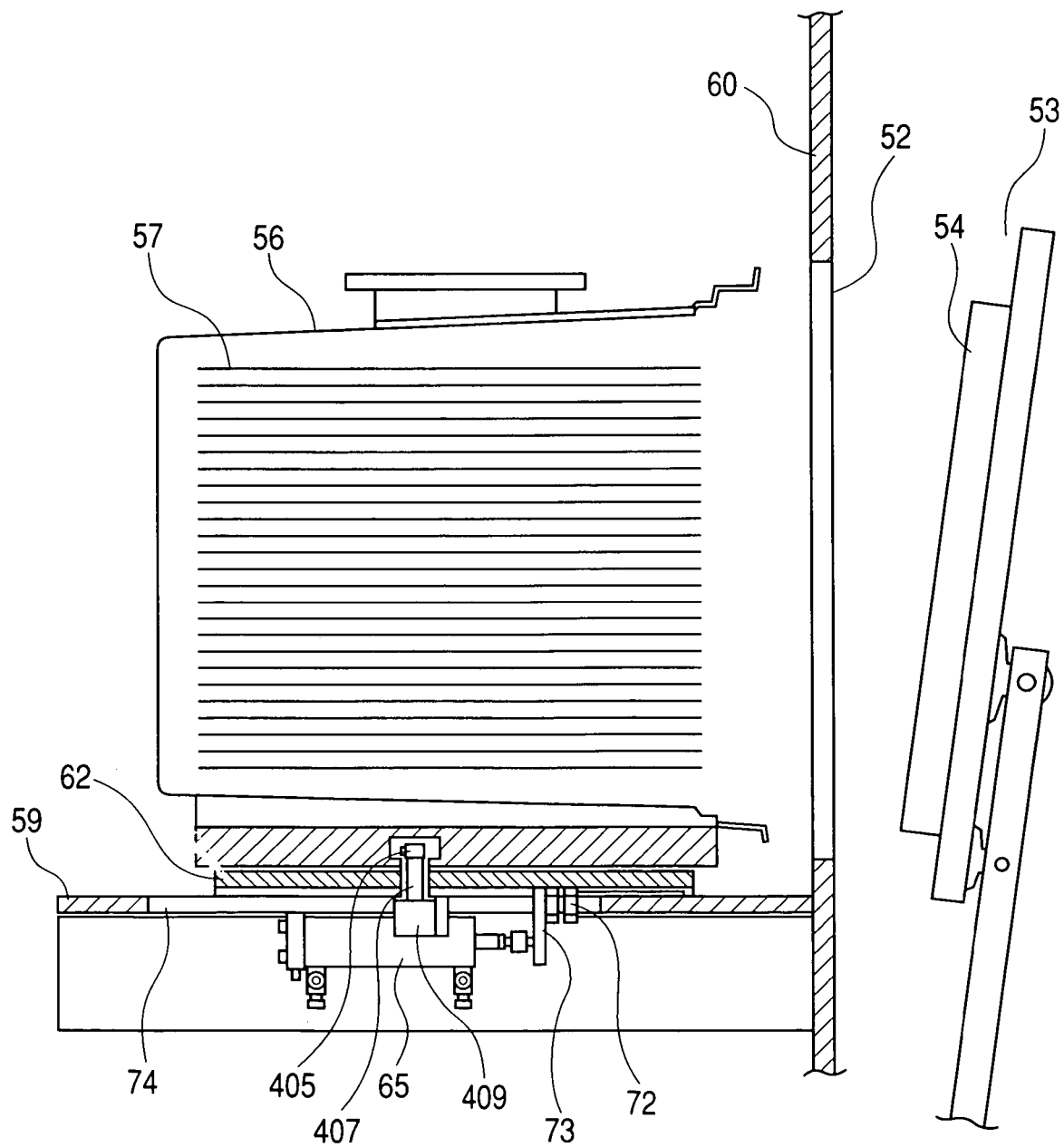
FIG. 23 is a side view including the partial section of the main elements in case of using the clamping unit according to a third embodiment of the present invention for the FIMS system shown in FIG. 3.

A mounting board 62, an opening 52 and a door 53 in the FIMS system 90 and a schematic sectional state of the configuration belonging to these elements are shown in FIG. 23. The mounting board 62 is arranged on a table 59 integrated with a wall 60 formed with the opening 52. The mounting board 62 is connected to an air cylinder 65 through a support member 73. The air cylinder 65 is fixed to a table 59 in the interior of a rectangular hole 74 provided in the table 59, and is used for allowing the mounting table 62 to approach to or to be spaced apart from the wall 60. The moving distance to the direction of the wall 60 of the mounting board 62 is defined by the abutment of an abutting member 72 against the end portion of a rectangular hole 74.

As described above, a lifting piston cylinder 409 is fixed to the under surface of the mounting board 62. Since the arrangement and relationship of each element configuring the horizontal cylinder and other clamping mechanisms are not particularly different from the content described in the embodiment, the description thereof will be omitted here. By using the clamping mechanisms comprising the configuration as described above, there will be no protruded member existing on the surface of the mounting board 62 except for a positioning pin. Consequently, it is possible to eliminate an unnecessary contact between the pod under surface and the mounting board surface and the wear and the like of the pod bottom portion accompanied with this contact. Further, with the mounting board surface made approximately flat, it is possible also to deal with an open cassette.

This application claims priority from Japanese Patent Applications No. 2003-363378 filed Oct. 23, 2003, No. 2004-015030 filed on Jan. 23, 2004, No. 2004-015034 filed on Jan. 23, 2004, No. 2004-016718 filed on Jan. 26, 2004 and No. 2004-016719 filed on Jan. 26, 2004, which are hereby incorporated by reference herein.

What is claimed is:

1. A pod clamping method for fixing a pod at an upper side of a mounting surface of a mounting board of a pod opener of a wafer processing apparatus, the pod configured to store a wafer and has a clamped portion that protrudes towards a center of an engaging concave portion provided in the bottom surface of the pod from a side of the engaging concave portion, said pod clamping unit comprising:

a first cylinder provided at an opposite side opposite to the upper side of the mounting surface, the first cylinder having a first cylinder rod extendable in a direction along an in-plane direction of the mounting board;

a second cylinder, which is fixed to an end of the first cylinder rod, the second cylinder having the second cylinder rod extendable in a direction out of the mounting surface on the mounting board, the second cylinder rod extending through an opening provided in the mounting board; and a clamp member fixed to an end of the second cylinder rod, wherein said pod clamping method comprises the steps of, mounting the pod on a predetermined position of the mounting surface of the mounting board;

extending the second cylinder rod to a lateral motion position that is farther than a distance between an inside surface of the clamped portion and the mounting surface on the mounting board by said second cylinder;

extending or retracting the first cylinder rod so as to position said clamp member in the engaging concave portion while keeping the lateral motion position by said first cylinder; and retracting the second cylinder rod so as to contact the inside surface of the clamped portion to press said clamp member onto the clamped portion said second cylinder, so as to fix the pod.

* * * * *